United States Patent [19]
Wendell

[11] Patent Number: 6,018,253
[45] Date of Patent: Jan. 25, 2000

[54] REGISTER WITH CURRENT-STEERING INPUT NETWORK

[75] Inventor: Dennis L. Wendell, Pleasanton, Calif.

[73] Assignee: Advanced Micro Devices, Inc., Sunnyvale, Calif.

[21] Appl. No.: 08/938,132

[22] Filed: Sep. 26, 1997

Related U.S. Application Data

[60] Provisional application No. 60/027,329, Sep. 30, 1996.

[51] Int. Cl.$^7$ .................................................... H03K 19/00
[52] U.S. Cl. ............................ 326/93; 326/115; 326/119; 326/121
[58] Field of Search ...................................... 326/115, 112, 326/119, 121, 93, 95, 98

[56] References Cited

U.S. PATENT DOCUMENTS

| | | | |
|---|---|---|---|
| 4,039,861 | 8/1977 | Heller et al. | 307/355 |
| 4,523,301 | 6/1985 | Kadota et al. | 365/49 |
| 4,716,320 | 12/1987 | McAdams | 307/530 |
| 5,552,728 | 9/1996 | Lin | 327/57 |
| 5,627,789 | 5/1997 | Kalb, Jr. | 365/205 |

Primary Examiner—Michael Tokar
Assistant Examiner—Anh Q Tran
Attorney, Agent, or Firm—Skjerven, Morrill, MacPherson, Franklin & Friel, L.L.P.; William W. Holloway

[57] ABSTRACT

A regenerative amplifier is coupled to a combinational current-steering network to provide a combinational logic and register combination. A differential change in current on the register's input nodes due to current steering is amplified to provide complementary logic values at the output nodes of the register responsive to a clock signal. Various combinational logic functions are implemented by current steering networks. Such a configuration provides the advantages of economy of size, cost and power consumption in the combinational layout because the current steering transistors may be made smaller. Furthermore, such a configuration provides the advantage of decreased set-up time in a registered data path and immunity from external sources of noise via common mode rejection. In one embodiment, a regenerative amplifier includes cross-coupled inverters. Current steering circuits steer current between regenerative amplifier input nodes depending on the output value of the logical function implemented by the combinational network.

25 Claims, 21 Drawing Sheets

REGISTER WITH CURRENT-STEERING INPUT NETWORK

CROSS-REFERENCE TO RELATED APPLICATIONS

This application claims the benefit of priority under 35 U.S.C. § 119(e) of U.S. Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors.

BACKGROUND OF THE INVENTION

1. Field of the Invention

The present invention relates in general to registers in electronic circuits, and, more particularly, to a regenerative latch having a current differential input.

2. Description of the Related Art

Standard sequential logic typically includes a combinational stage driving a voltage signal into a register. For example, one popular implementation of a register having multiplexed inputs includes the use of multiple totem poles of transistors driving a master/slave latch. A two-to-one multiplexer may include two totem poles of four transistors each with the transistors coupled in series between $V_{DD}$ and ground. Each totem pole has an output in the middle of the totem pole, a select input to the gates of the center transistors and a data input to the gates of the transistors near the reference voltage rails. The master/slave latch is controlled by a clock signal, possibly via transmission gates controlling the flow of the selected data signal from the totem pole mux to RS latches. Alternatively, data signals may be passed through transmission gates controlled by select signals. Other combinational gates such as AND, OR, NOT, NAND and NOR gates drive similar voltage signals into clocked registers.

Because such implementations add to the setup time of the circuit, the transistors of the combinational element are usually made as large as possible with very little fan-out. Very little fan-out requires that the circuit be tapered up or that the output signal be buffered, thereby increasing the amount of layout area used by the circuit. Also, larger transistors increase the area used by repeated circuits. When a circuit is repeated throughout an integrated circuit, such internal increases in required area can significantly impact the total area required. Input capacitance is also higher due to increased width of input transistors.

SUMMARY OF THE INVENTION

It has been discovered that a current-sensing regenerative amplifier may be coupled to a combinational current-steering network to provide a combinational logic and register combination. For example, a current-steering multiplexing network coupled to a current-sensing regenerative amplifier provides a multiplexed-input register. A current differential data signal that is output by a current steering multiplexer is read by a regenerative amplifier based register. A differential change in current on the register's input nodes is amplified to provide complementary logic values at the output nodes of the register responsive to a clock signal. In other embodiments, other combinational logic functions may be implemented by current steering networks. The outputs of such networks carry a differential current which is sensed by a regenerative amplifier, amplified to logical values and output responsive to a clock signal.

Such a configuration provides the advantages of economy of size, cost and power consumption in the combinational layout because the current steering transistors may be made smaller. Furthermore, such a configuration provides the advantage of decreased set-up time in a registered data path and immunity from external sources of noise via common mode rejection.

In one embodiment, an apparatus includes a regenerative amplifier and a current steering combinational network. The regenerative amplifier includes a first inverter having a first input and a first output, and a second inverter having a second input and a second output. The second input is coupled to the first output, and the second output is coupled to the first input. The current steering combinational network is coupled to the regenerative amplifier. The current steering combinational network is coupled to receive at least one digital data signal for performing a logical function upon the data signal. The current steering combinational network includes first and second current steering circuits. The first current steering circuit is for steering current to the first input when a result of the logical function has a first value and for steering current from the first input when the result of the logical function has a second value. The second current steering circuit is for steering current to the second input when the result of the logical function has the second value and for steering current from the second input when the result of the logical function has the first value.

In another embodiment, a microprocessor includes a regenerative amplifier based register having current-steering combinational inputs. In another embodiment, a computer system includes a regenerative amplifier based register having current-steering combinational inputs.

In another embodiment, a regenerative amplifier based register having current-steering combinational inputs is provided. Data signals are input to the current steering combinational network. The regenerative amplifier is clocked. The regenerative amplifier senses the data output by the combinational network responsive to the clocking. The regenerative amplifier generates an output signal. The regenerative amplifier is precharged to a precharge state after the generating the output signal.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

In one embodiment of the invention, registers in a processor of a computer system use a regenerative stage with current steering network(s). The steering networks develop signals across load transistors in a regenerative amplifier based register. A differential current data signal that is output by a current steering multiplexer is read by the regenerative amplifier based register and amplified to provide complementary logic values at the output nodes of the register responsive to a clock signal. As used herein, a current differential input or a differential current signal is defined to mean two nodes upon which current is steered in different directions and the signal represented by the differentially steered currents. The complementary logic values are indicative of a difference between the two input currents of the register. Other embodiments include various combinational logic functions implemented through current steering networks.

Figure 1A:
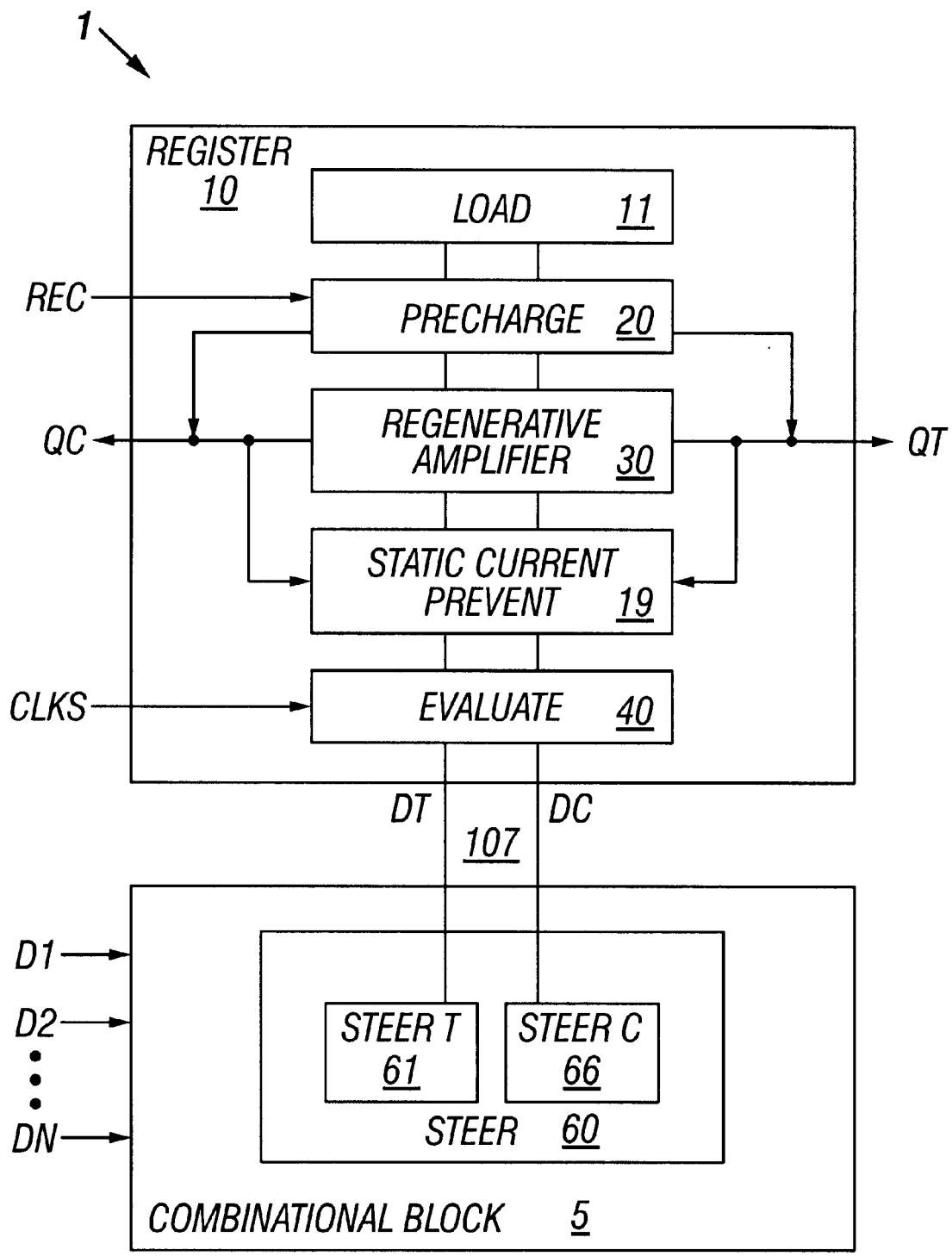
FIG. 1A illustrates a block diagram of a register with combinational inputs according to an embodiment of the invention.

FIG. 1A shows a current based sequential element 1 which includes combinational block 5 and register 10. Combinational block 5 performs a specific logical function (e.g., identity, inverse, AND, NAND, OR, NOR, XNOR, minority, majority, etc.) on one or more data signals D1–DN. For example, in the case of identity, a data input is received by combinational block 5 and then registered by register 10. In the case of inverse or NOT, a data input is received and inverted by combinational block 5 and then registered by register 10.

Combinational block 5 includes current steering circuit 60. Current steering circuit 60 includes true node steering circuit 61 and complement node steering circuit 66. Current steering circuit 60 steers current to and from nodes DT or DC depending on the output value of the logic function performed by combinational block 5 on data inputs D1–DN. For example, in an embodiment where combinational block 5 is an inverter receiving a single input D1, true node steering circuit 61 steers current onto node DT and complement node steering circuit 66 steers current from node DC when D1 is low, and true node steering circuit 61 steers current from node DT and complement node steering circuit 66 steers current to node DC when D1 is high. In an embodiment where combinational block 5 merely passes on the value of input D1 (identity), true node steering circuit 61 steers current onto node DT and complement node steering circuit 66 steers current from node DC when D1 is high, and true node steering circuit 61 steers current from node DT and complement node steering circuit 66 steers current to node DC when D1 is low.

Register 10 includes load circuit 11, precharge circuit 20, regenerative amplifier 30, static current prevent circuit 19, and evaluate circuit 40, each coupled by true and complement connections. Precharge circuit is further coupled to regenerative amplifier 30 output nodes QT and QC via precharge lines. Output nodes QT and QC may be coupled to static current prevent circuit 19 to prevent crowbar current due to data transitions when regenerative amplifier 30 is activated by evaluate circuit 40. Register 10 is coupled to combinational block 5 via true and complement connections DT and DC.

Figure 1B:
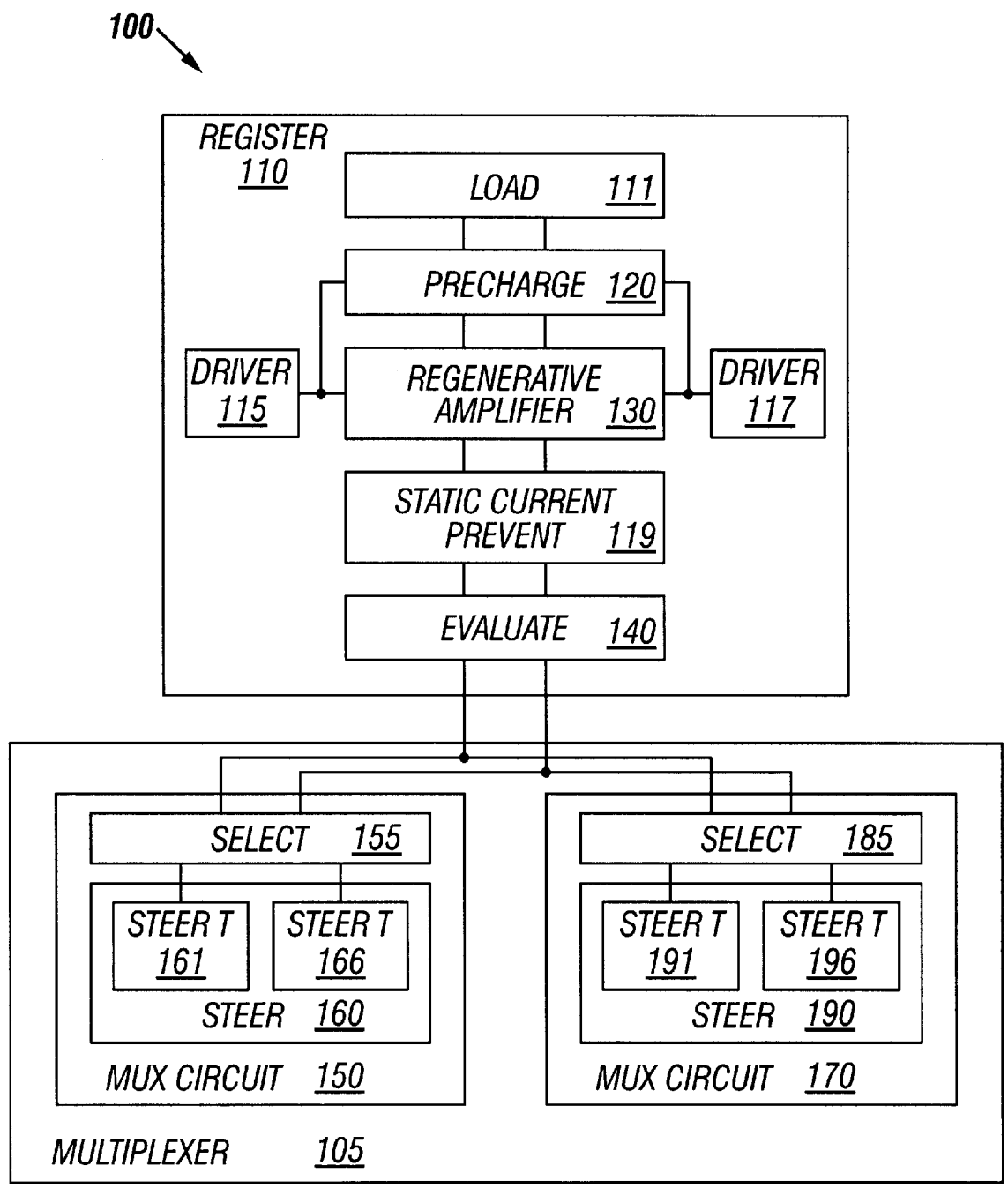
FIG. 1B illustrates a block diagram of a register with multiplexed inputs according to an embodiment of the invention.

In one embodiment of the invention, combinational block 5 performs the function of multiplexing data input signals. FIG. 1B shows a multiplexed-input register 100 which includes multiplexer 105 and register 110. Multiplexer 105 includes mux circuit 150 for selecting a first data input signal and mux circuit 170 for selecting a second data input signal. Mux circuit 150 includes select circuit 155 and current steering circuit 160. Current steering circuit 160 includes true node steering circuit 161 and complement node steering circuit 166. Mux circuit 170 includes select circuit 185 and current steering circuit 190. Current steering circuit 190 includes true node steering circuit 191 and complement node steering circuit 196. Register 110 includes load circuit 111, precharge circuit 120, regenerative amplifier 130, driver circuits 115, 117, static current prevent circuit 119, and evaluate circuit 140, each coupled by true and complement connections. Register 110 is coupled to multiplexer 105 via true and complement connection 107.

Figure 1C:
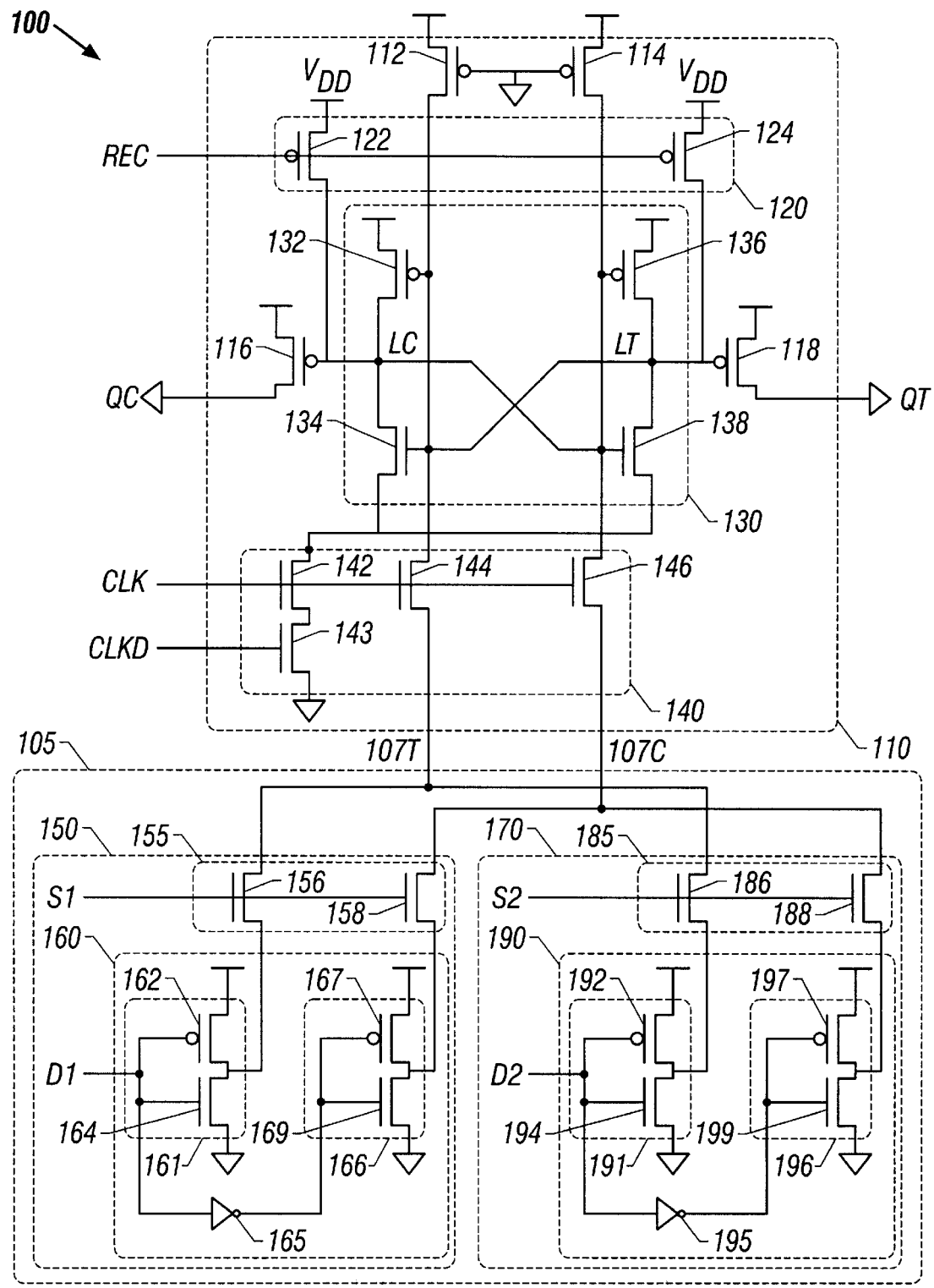
FIG. 1C illustrates a circuit diagram of a register with multiplexed inputs according to an embodiment of the invention.

Referring to FIG. 1C, multiplexed-input register 100 is shown in greater detail. Multiplexer 105 includes data inputs D1 and D2 and select inputs S1 and S2, and provides true and complement current-differential mux output 107 to register 110. (As used herein, circuit node identifiers also identify the signals carried thereon; therefore, node or input D1 carries signal D1.) In other embodiments, multiplexer 105 may include fewer or more inputs depending on the requirements of each particular embodiment. Register 110 receives the current differential input from multiplexer 105, clock signals CLK and CLKD, and a precharge signal REC, and provides true and complement output signals QT and QC. Register 110 is a regenerative latch which differentially senses current change when the register clocked.

Multiplexer 105 includes a first current steering mux circuit 150 and a second current steering mux circuit 170. Each of mux circuits 150 and 170 receives a data signal (e.g., one of D1 and D2) and a select signal (e.g., one of S1 and S2). In other embodiments, multiplexer 105 may further include a decoder so that multiplexer 105 can derive select signals S1 and S2 from a single select input signal. Signals S1 and S2 do not select their respective data signals simultaneously; therefore, only one data signal is differentially passed to register 110 via differential output 107. Each mux circuit uses a select signal to select or deselect a corresponding data signal.

For example, as shown in FIG. 1C, mux circuit 150 includes select circuit 155 which selects signal D1 when signal S1 has a first value and deselects signal D1 when signal S1 has a second value. In the embodiment shown, select circuit 155 includes switches for coupling and decoupling signal D1 to differential output 107. When signal S1 is low, signal S1 deselects signal D1 by decoupling signal D1 from differential mux output 107. When signal S1 is high, signal S1 selects signal D1 by coupling signal D1 (or a signal derived therefrom) to differential mux output 107. One simple implementation is the use of NMOS (N-channel Metal-Oxide Semiconductor) transistors 156 and 158. Each of transistors 156 and 158 have a gate coupled to signal S1, a drain coupled to a node differential output 107 and a source coupled to a current steering circuit of mux circuit 150. When signal S1 is high, NMOS transistors 156 and 158 turn on, thereby coupling current steering circuit 160 to nodes 107T and 107C. When signal S1 is low, NMOS transistors 156 and 158 turn off, thereby decoupling current steering circuit 160 from nodes 107T and 107C.

Similarly, mux circuit 170 includes select circuit 185 which selects signal D2 when signal S2 has a first value and deselects signal D2 when signal S2 has a second value. In the embodiment shown, select circuit 185 includes switches for coupling and decoupling signal D2 to differential output 107. More specifically, select circuit 185 includes NMOS transistors 176 and 178. When signal S2 is low, signal S2 deselects signal D2 by decoupling signal D2 from differential mux output 107. When signal S2 is high, signal S2 selects signal D2 by coupling signal D2 (or a signal derived therefrom) to differential mux output 107. Each of transistors 176 and 178 have a gate coupled to signal S2, a drain coupled to a node differential output 107 and a source coupled to a current steering circuit of mux circuit 170. When signal S2 is high, NMOS transistors 186 and 188 turn on, thereby coupling current steering circuit 190 to nodes 107T and 107C. When signal S2 is low, NMOS transistors 186 and 188 turn off, thereby decoupling current steering circuit 190 from nodes 107T and 107C.

Mux circuit 150 includes current steering block 160 that is active when data signal D1 is selected by select circuit 155. When active, current steering block 160 steers current onto a first node of differential output 107 and steers current from a second node of differential output 107 depending on the value of data signal D1. For example, in the embodiment shown, current steering block 160 includes a first current steering circuit 161, an inverter 165 and a second current steering circuit 166. Exemplary first current steering circuit 161 includes a CMOS inverter (Complementary MOS, e.g., PMOS transistor 162 and NMOS transistor 164) which drives current onto the positive node 107T of differential output 107 when data signal D1 is low and which drives current from positive node 107T when data signal D1 is high. Second current steering circuit 166 also includes a CMOS inverter (e.g., PMOS transistor 167 and NMOS transistor 169) and receives an inverted data signal D1. Second current steering circuit 166 drives current from the negative node 107C of differential output 107 when data signal D1 is low and which drives current onto negative node 107C when data signal D1 is high.

Similarly, mux circuit 170 includes current steering block 190 that is active when data signal D2 is selected by select circuit 185. When active, current steering block 190 steers current onto a first node of differential output 107 and steers current from a second node of differential output 107 depending on the value of data signal D2. For example, in the embodiment shown, current steering block 190 includes a first current steering circuit 191, an inverter 195 and a second current steering circuit 196. Exemplary first current steering circuit 191 includes a CMOS inverter (e.g., PMOS transistor 192 and NMOS transistor 194) which drives current onto positive node 107T when data signal D2 is low and which drives current from positive node 107T when data signal D2 is high. Second current steering circuit 196 also includes a CMOS inverter (e.g., PMOS transistor 197 and NMOS transistor 199) and receives an inverted data signal D2. Second current steering circuit 196 drives current from the negative node 107C of differential output 107 when data signal D2 is low and which drives current onto negative node 107C when data signal D2 is high.

Figures 1, 4A:
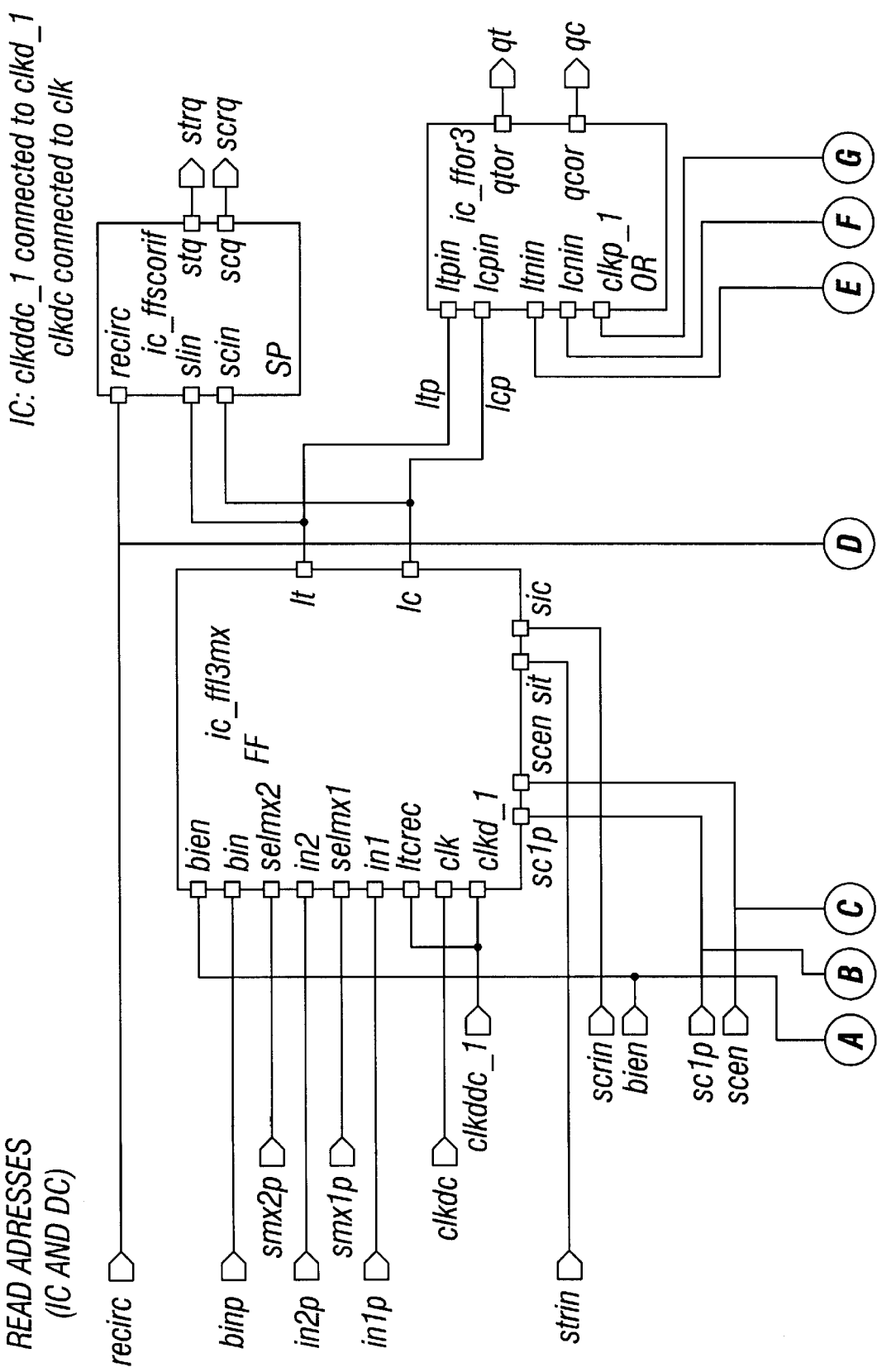
FIG. 4A illustrates a block diagram of a circuit macro including a register with multiplexed inputs according to an embodiment of the invention.
Figures 2, 4A:
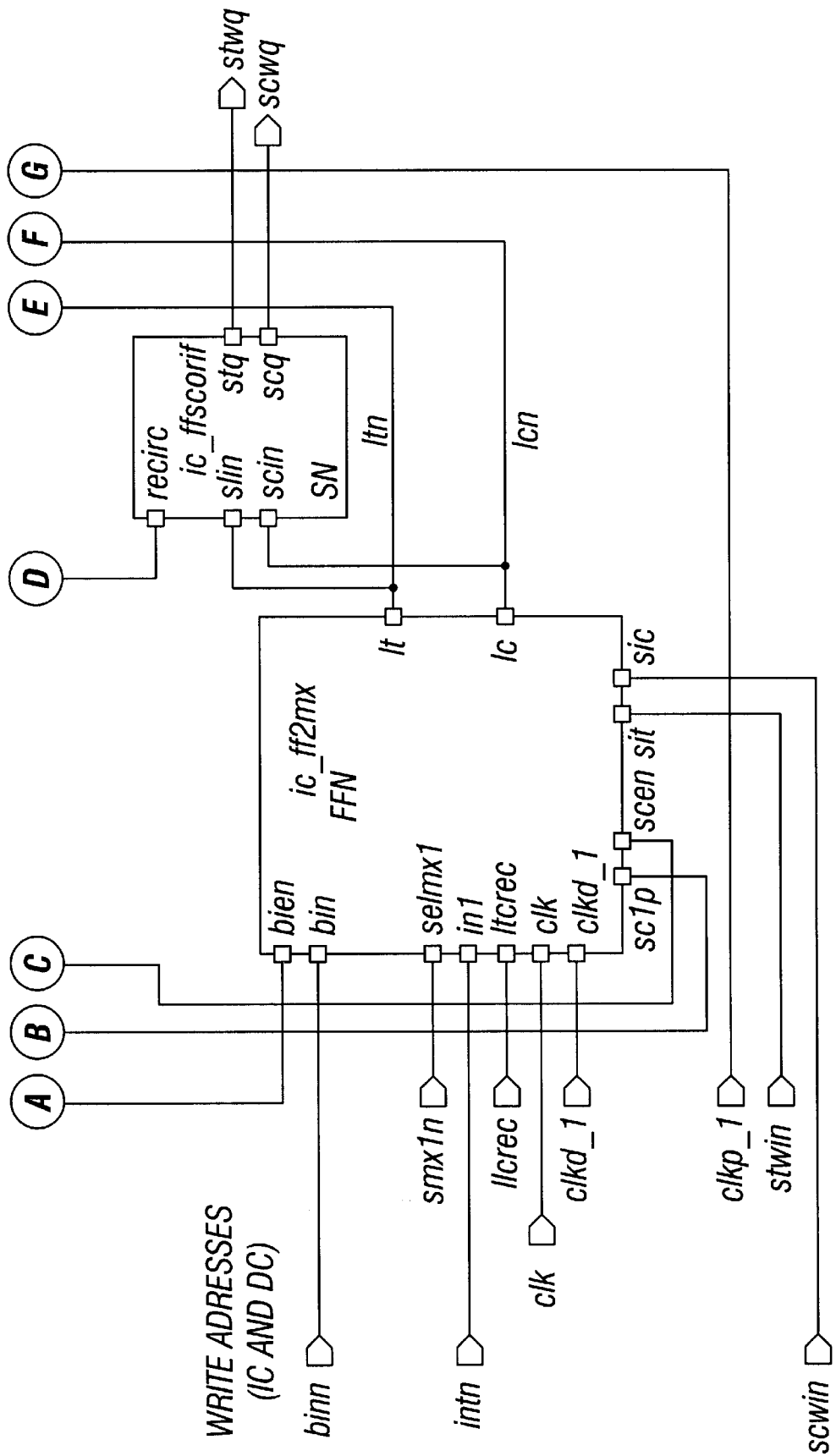

Register 110 includes load circuit 111, precharge circuit 120, regenerative amplifier 130, evaluate circuit 140 and driver circuits 115, 117. The multiplexing steering networks develop signals across the load circuit 111. In the embodiment of FIG. 1, load circuit 111 includes PMOS transistors 112, 114 having gates coupled to ground so that transistors 112 and 114 are always conducting and providing a predetermined resistance.

Precharge circuit 120 receives precharge signal REC. Precharge signal REC is an active low signal that precharges the input/output nodes (LT, LC) of regenerative amplifier 130 to a first reference value (e.g., $V_{DD}$) when the register is in a recover state. Register 110 is in a recover state between reads by regenerative amplifier 130 of the differential value provided by current steering multiplexer 105. For example, PMOS transistors 122 and 124 each include a gate coupled to precharge signal REC, a source coupled to $V_{DD}$ and a drain coupled to an output of regenerative amplifier 130. When REC is low, transistors 122 and 124 are turned on so that nodes LT and LC of regenerative amplifier 130 are precharged to $V_{DD}$. When LT and LC are at $V_{DD}$, driver transistors 116 and 118 are turned off, thereby disconnecting register outputs QT and QC.

Evaluate circuit 140 receives clock signal CLK and initiates reads of differential output 107 of multiplexer 105 by coupling regenerative amplifier 130 to multiplexer 105 via switches 144 and 146, and by coupling regenerative amplifier to a second reference value (e.g., ground) via switch 142. For example, in the embodiment of FIG. 1, NMOS transistors 144 and 146 are turned on when CLK is high, thereby coupling regenerative amplifier 130 to multiplexer 105. Also, transistor 142 is turned on when CLK is high so that regenerative amplifier 130 is enabled to allow positive feedback in regenerative amplifier 130. That is, when transistor 142 is on, discharge paths are available to regenerative amplifier 130 to conditionally discharge one of the precharged nodes LT, LC depending on the value of the data signal read from multiplexer 105.

Evaluate circuit 140 is further coupled to receive a delayed clock signal CLKD. Evaluate circuit 140 includes a switch (e.g., NMOS transistor 143) which is controlled by CLKD coupled between NMOS transistor 142 and ground. NMOS transistor 143 has a drain coupled to the source of NMOS transistor 142, a source coupled to ground and a gate coupled to receive the delayed clock signal CLKD. The delayed clock signal may be connected to precharge signal REC or may be independent of other signals. When precharge signal REC is independent of the delayed clock signal CLKD, data is clocked into register 110 on the rising edge of CLK and is clocked out on the falling edge of CLK. CLKD may exist on either CLK edge. Such an embodiment is discussed hereinafter in reference to FIG. 3.

Figure 1D:
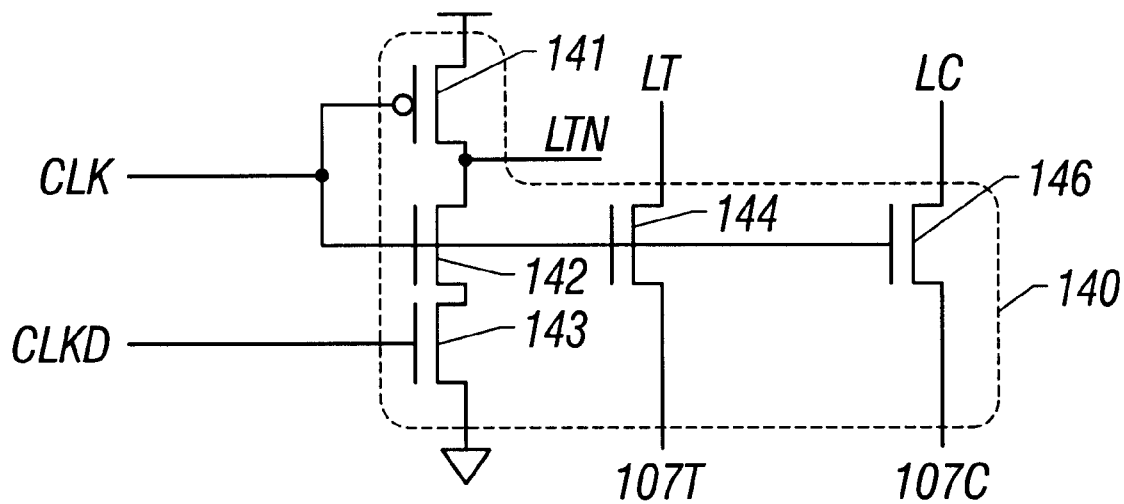
FIG. 1D illustrates a circuit diagram of an evaluate circuit according to an embodiment of the invention.

Referring to FIG. 1D, evaluate circuit 140 may additionally include a trip delay circuit 141. In the embodiment of FIG. 1D, trip delay circuit 141 is transistor 141. Transistors 141 and 142 provide an inverter with an input receiving the clock signal CLK and an output LTN coupled to the discharge path of regenerative amplifier 130 (e.g., the source nodes of NMOS transistorsl34, 138). The inverter has a higher trip point than transistors 144 and 146. As a result of the higher trip point, regenerative amplifier 130 is discharged at a point in time after current has developed on nodes LT and LC. Thus, clock transistors 144 and 146 turn on first to develop signal current on nodes LT and LC before transistor 142 turns on to initiate sensing by regenerative amplifier 130. By including trip delay circuit 141 in evaluate circuit 140, the activation of regenerative amplifier 130 is delayed.

Referring again to FIG. 1C, regenerative amplifier senses differential changes in current on nodes 107T and 107C and provides complementary logic values at nodes LC and LT responsive thereto. Regenerative amplifier 130 is a bistable element including a cross-coupled pair of CMOS inverter elements. Other embodiments of the invention may include other types of regenerative amplifiers. In the embodiment of FIG. 1, regenerative amplifier 130 has a bistable element embodied by a pair of PMOS transistors 132 and 136 and a pair of NMOS transistors 134 and 138. Sources of the N-channel devices are tied to a node and driven by clock signal CLK through transistor 142 to ground. Sources of the P-channel devices are connected to a positive power supply with respect to ground. Output nodes LT and LC of the bistable element are coupled to differential input lines 107T and 107C, respectively, through N-channel pass gates 144 and 146. Gates of NMOS transistors 144 and 146 comprise a regenerative amplifier enable line coupled to the clock signal CLK.

With this configuration, the node coupled to the sources of NMOS transistors 134, 138 is decoupled from ground by evaluate circuit 140 while the regenerative amplifier enable signal CLK is not active. Accordingly, the bistable element is not activated and no positive feedback occurs within it. Additionally, nodes LT and LC are precharged by precharge circuit 120. The precharge elements of precharge circuit 120 are shut off before regenerative amplifier 130 reads input nodes 107T and 107C. While clock signal CLK is inactive or low, a differential between the voltages on the multiplexer output nodes 107T and 107C is developed as a result of the current steering operation of multiplexer 105 and the value of the selected data signal. When CLK becomes active and enables the regenerative amplifier, the sources of NMOS transistors 134 and 138 are pulling down to ground. Because one $V_{GS}$ is higher than the other $V_{GS}$ due to the differential current applied to nodes LT/107T and LC/107C by the current-steering networks of multiplexer 105, one of transistors 134 and 138 is pulling down harder than the other. For example if $V_{GST}$ is higher than $V_{GSC}$, transistor 134 turns on first and pulls down harder on node LT because transistor 134 conducts more due to its higher gate-to-source voltage. Because transistor 134 pulls node LT down harder, transistor 138 is further turned off. In other words, the slight differential between the mux output nodes 107T and 107C is quickly amplified to a rail-to-rail differential between nodes 107T/LT and 107C/LC due to the regenerative action of regenerative amplifier 130. Driver circuits 115 and 117 then conditionally drive the resulting output signal onto the corresponding output node QT or QC as described below.

Register 110 includes driver circuits 115, 117. In the embodiment of FIG. 1C, driver circuits 115 and 117 include driver transistors 116 and 118. Register outputs QT and QC are either held high or disabled by circuits 115, 117. When QT and/or QC are disabled (e.g., when precharge signal REC is active), a keeper circuit (not shown) pulls the disabled nodes low. QT and QC are both high during the precharge or recovery state. During the data sensing and output state, one of QT and QC is high while the other of QT and QC is disabled depending on the data value sensed by register 110. Driver circuits 115 and 117 may be modified or eliminated depending on the type of signals required from register 10.

Figure 1E:
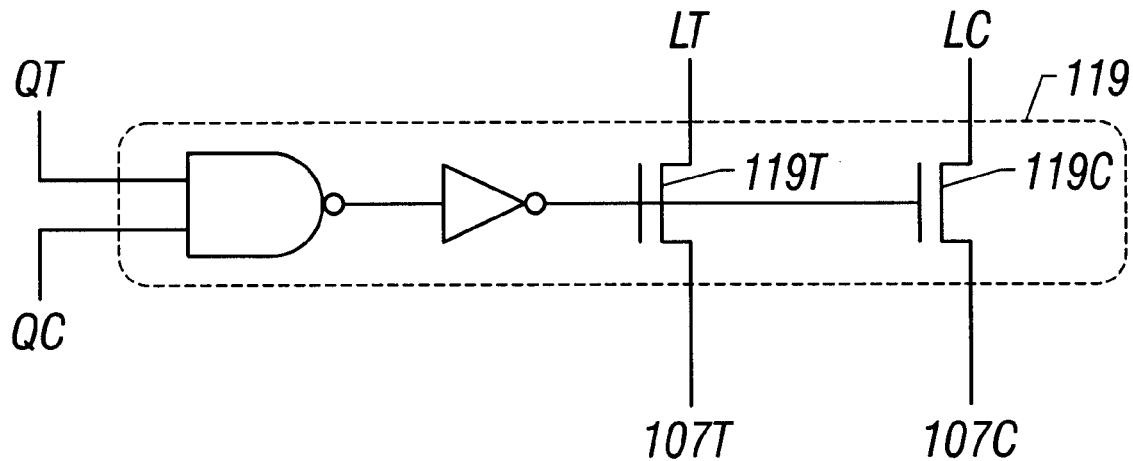
FIG. 1E illustrates a circuit diagram of a static current prevention circuit according to an embodiment of the invention.

Referring to FIG. 1B, Register 10 includes crowbar current prevention circuit 119 to prevent current during data transitions while the clock is active. For example, NMOS transistors could be placed between register 110 and multiplexer 105 such that register 110 and multiplexer 105 are decoupled during data transitions. Referring to FIGS. 1C and 1E, a first NMOS transistor 119T could be placed such that its drain is coupled to node LT and its source is coupled to the evaluate circuit (e.g., to the drain of transistor 146). A second NMOS transistor 119C could be placed such that its drain is coupled to node LC and its source is coupled to the evaluate circuit (e.g., to the drain of transistor 144). Alternatively, NMOS transistors 119T and 119C could be coupled to the circuit at other locations as long as crowbar current is prevented when the transistors are turned off. A control circuit may derive a control signal to be applied to the gates of transistors 119T, 119C. For example, a NAND gate may have inputs coupled to receive QT and QC and an output coupled to an inverter which in turn has an output coupled to the gates of the NMOS transistors. In this example, when QT and QC are both high, a high control signal is applied to the gates of transistors 119T, 119C to turn transistors 119T, 119C on. When the control signal is driven low (e.g., by a transition of a data signal when the clock signal is active) there is no crowbar current form $V_{DD}$ to ground.

Figure 12:
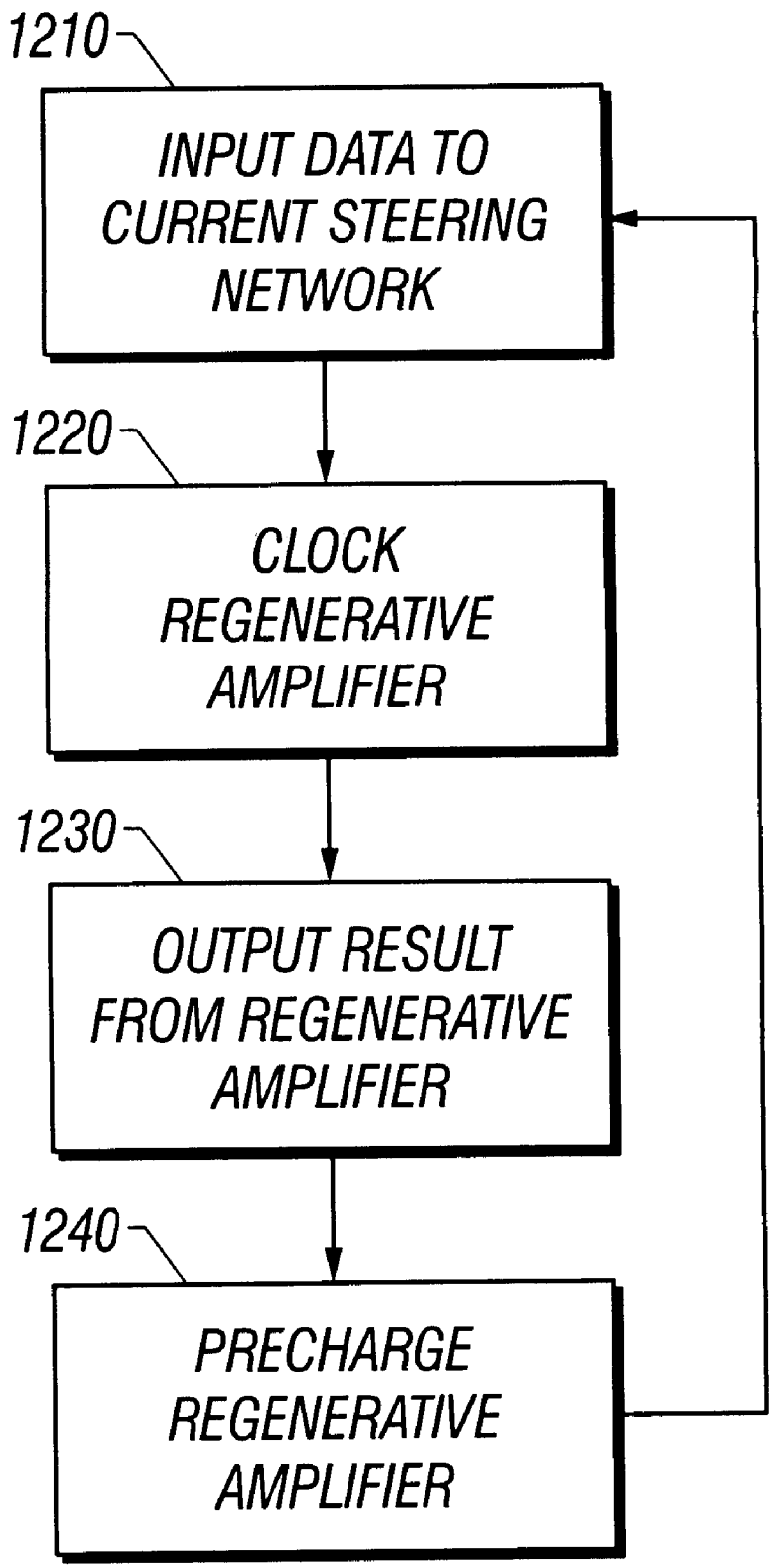
FIG. 12 illustrates a flow chart showing the operation of a register with current-steered combinational inputs according to an embodiment of the invention.

FIG. 12 shows the operation of a regenerative amplifier based register having current-steered combinational inputs. At step 1210, data is input to current steering combinational network 5. Control then transitions to step 1220. During step 1220, regenerative amplifier 30 is clocked so that regenerative amplifier can conditionally discharge, thereby sensing the result of the logical function performed by combinational block 5 and output therefrom onto current differential node 107. During the conditional discharge ("data sensing"), crowbar current is prevented by static current prevent circuit 19. Control then transitions to step 1230. During step 1230, regenerative amplifier 30 outputs the sensed data as a result of the load developed over load circuit 11 by combinational block 5. Control then transitions to step 1240. During step 1240, regenerative amplifier 30 is precharged to prepare for sensing the next data input on the next clock.

Figure 2:
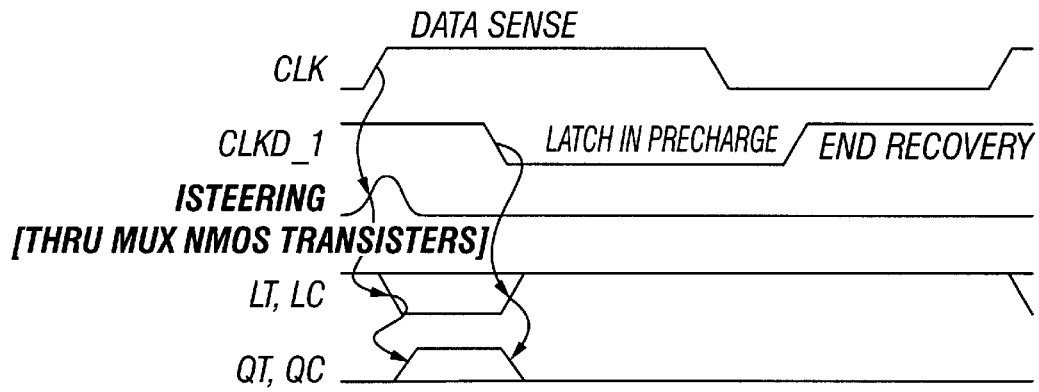
FIG. 2 illustrates a timing diagram showing the operation of an embodiment of the present invention.

FIG. 2 shows the operation of an embodiment of multiplexed-input register 100 useful in data and instruction based cache memory systems such as instruction cache 1102 and data cache 1140, discussed hereinafter with reference to FIG. 11. When CLK becomes active (e.g., on the rising edge of CLK), the circuit enters the data sensing state. In the data sensing state, CLK couples register 110 to multiplexer 105 via evaluate circuit 140. The current steering networks of multiplexer 105 then steer current onto a first node of 107T and 107C, and steer current from a second node of 107T and 107C depending on the value of the data signal selected by multiplexer 105. The current steering function is shown in FIG. 2 as the magnitude of differential current (labeled $I_{STEERING}$) In one embodiment, 10–25 microamps are required to force a transition of regenerative amplifier 130. In other embodiments, the circuit may be designed with lower or higher thresholds taking into account the system requirements regarding noise and speed, etc. When the threshold is reached, regenerative amplifier 130 conditionally changes state as described above, and QT and QC are driven with the value stored by register 110.

Precharge signal REC is a delayed version of clock signal CLK. In the later portion of CLK's active state, REC becomes active, thereby forcing the circuit into a precharge state. In the precharge state, register outputs QT and QC are disabled and the input lines to regenerative amplifier 130 are precharged for subsequent reads.

Figure 3:
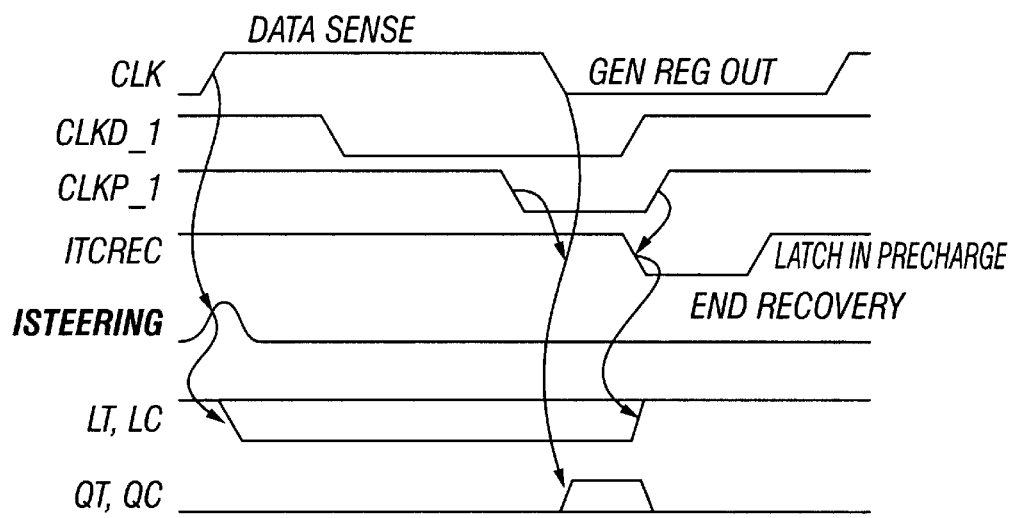
FIG. 3 illustrates a timing diagram showing the operation of an embodiment of the present invention.

FIG. 3 shows another embodiment in which data is read by register 110 on the positive edge of clock signal CLK and output on the negative edge of clock signal CLK. Such an embodiment is useful as an input register in a data cache memory such as data cache 1140, discussed hereinafter. A feedback NMOS may be used to keep latching node LTN low. Referring to FIG. 3, when CLK becomes active (e.g., on the rising edge of CLK), the circuit enters the data sensing state. In the data sensing state, the current steering networks of multiplexer 105 steer current onto a first node of 107T and 107C, and steer current from a second node of 107T and 107C depending on the value of the data signal selected by multiplexer 105. The current steering function is shown in FIG. 3 as the magnitude of differential current (labeled $I_{STEERING}$) When the threshold of regenerative amplifier 130 is reached, regenerative amplifier 130 conditionally changes state as described above.

Precharge signal REC is indirectly dependent on clock signal CLK. A first CLK dependent signal CLKD is a delayed derivative of the clock signal CLK. A second CLK dependent signal CLKP is a shortened active pulse width version of the clock signal CLK. The falling (active) edge of CLKP is generated from the falling edge of CLK. On the rising edge of CLKP, precharge signal REC is driven low (active), thereby forcing the circuit into a precharge state. In the precharge state, register outputs QT and QC are disabled and the input lines to regenerative amplifier 130 are precharged for subsequent reads. Precharge signal REC becomes high (inactive) before the next rising edge of CLK.

Multiplexed-input register 100 may be used in any of various circuit macros to multiplex and register data, for example. FIG. 4A shows a block level diagram of a circuit macro including several current-steered registers according to an embodiment of the invention. Circuit 400 is a driver for a row predecoder within a cache memory of a microprocessor. Circuit 400 generates row decode addresses for writes and reads. For example, write addresses for a data cache are generated during the first half cycle of CLK, and read addresses are generated during the second half cycle of CLK.

Figures 1, 4B:
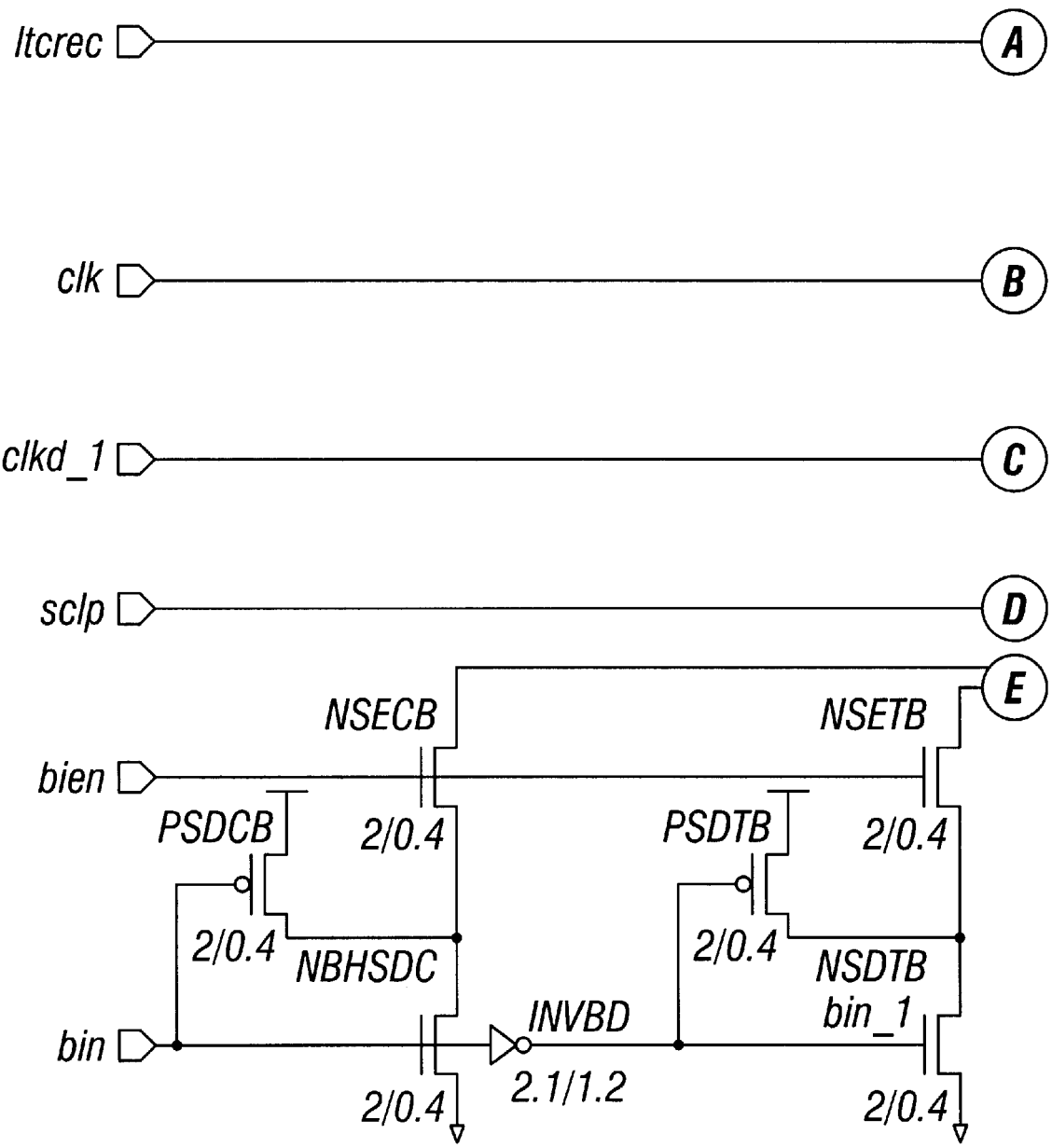
FIG. 4B illustrates a circuit diagram of a register with multiplexed inputs according to an embodiment of the invention.
Figures 2, 4B:
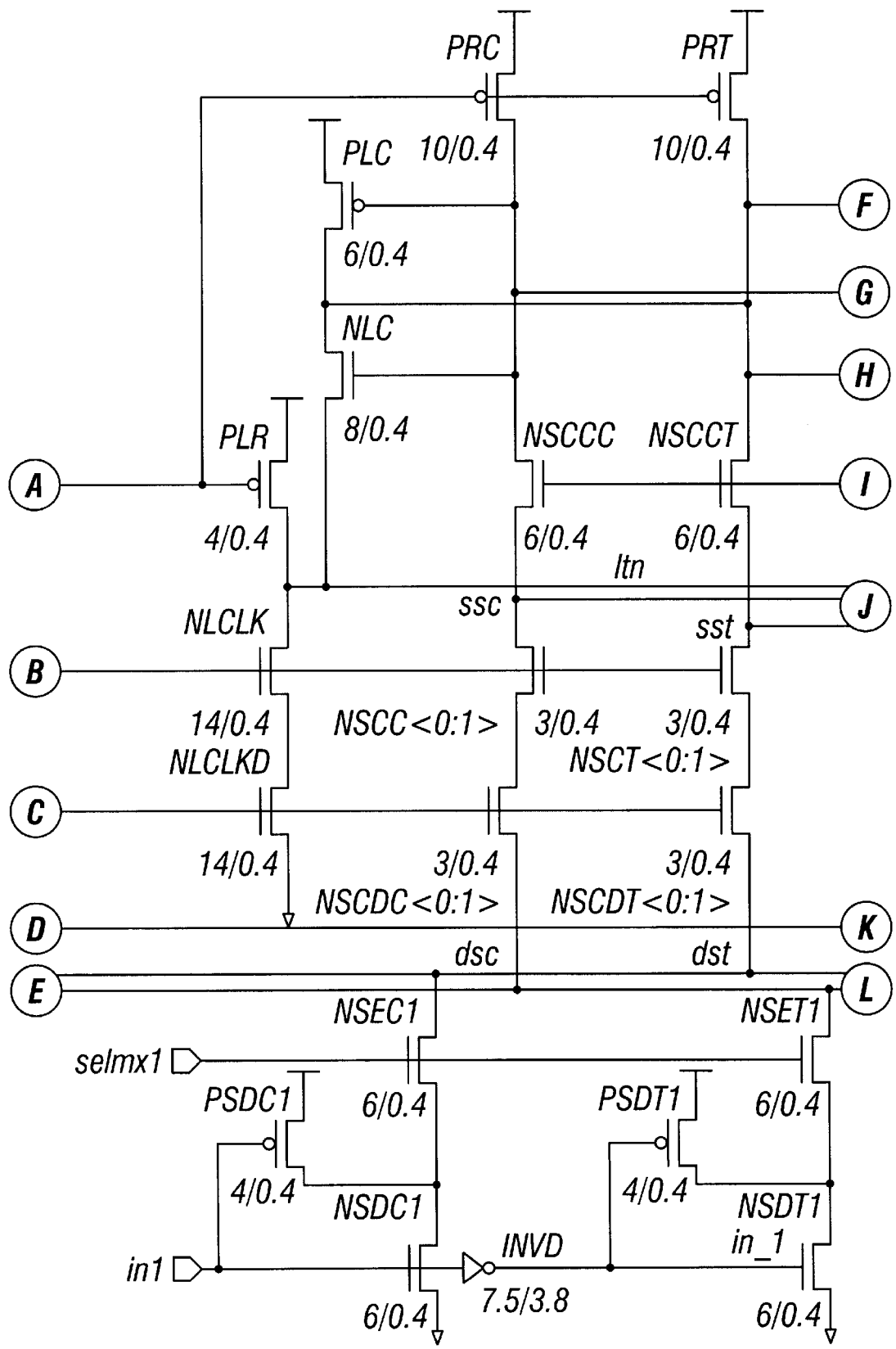
Figures 3, 4B:
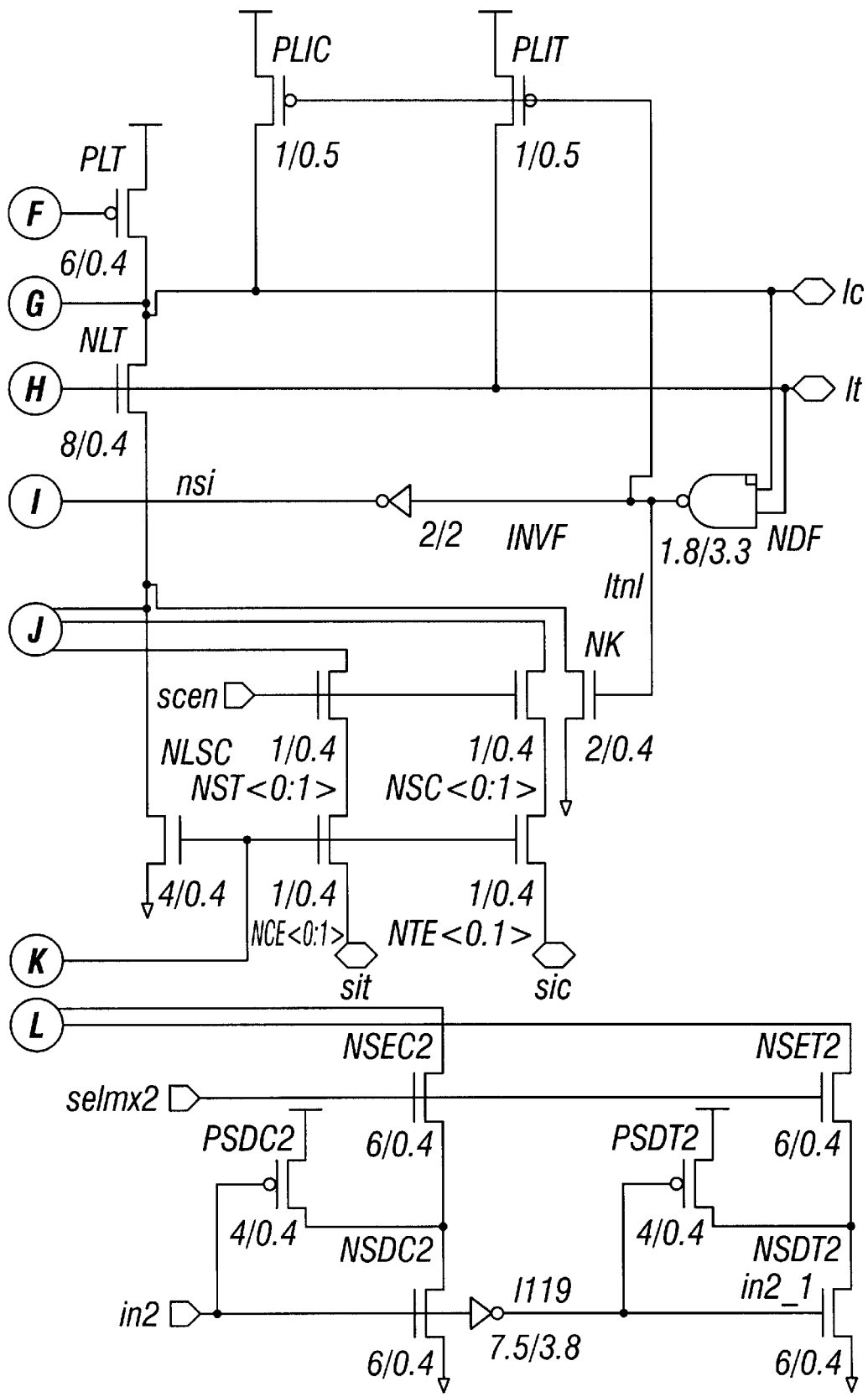
Figures 1, 4C:
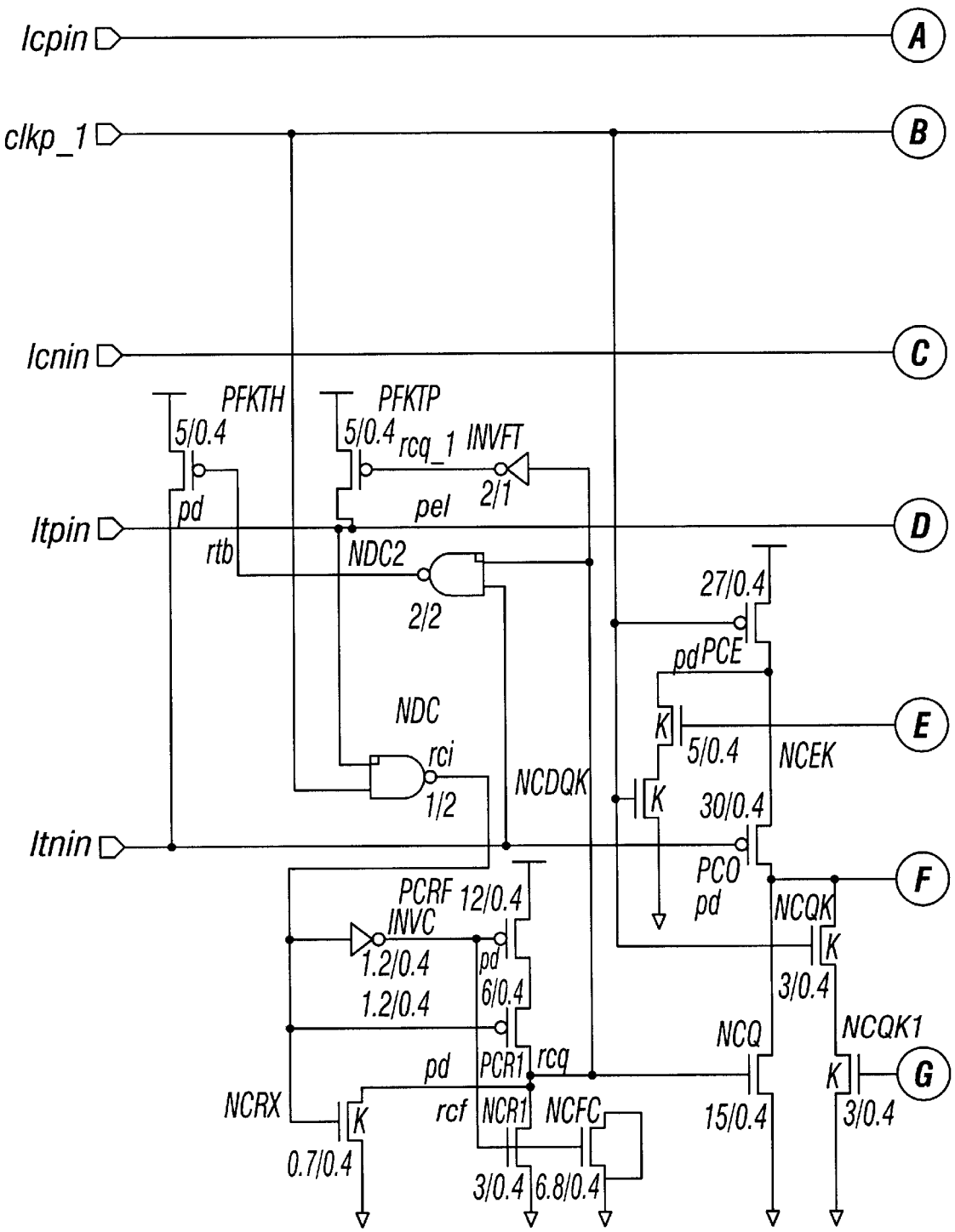
FIG. 4C illustrates a circuit diagram of a dynamic OR gate used in the circuit macro of FIG. 4A.
Figures 2, 4C:
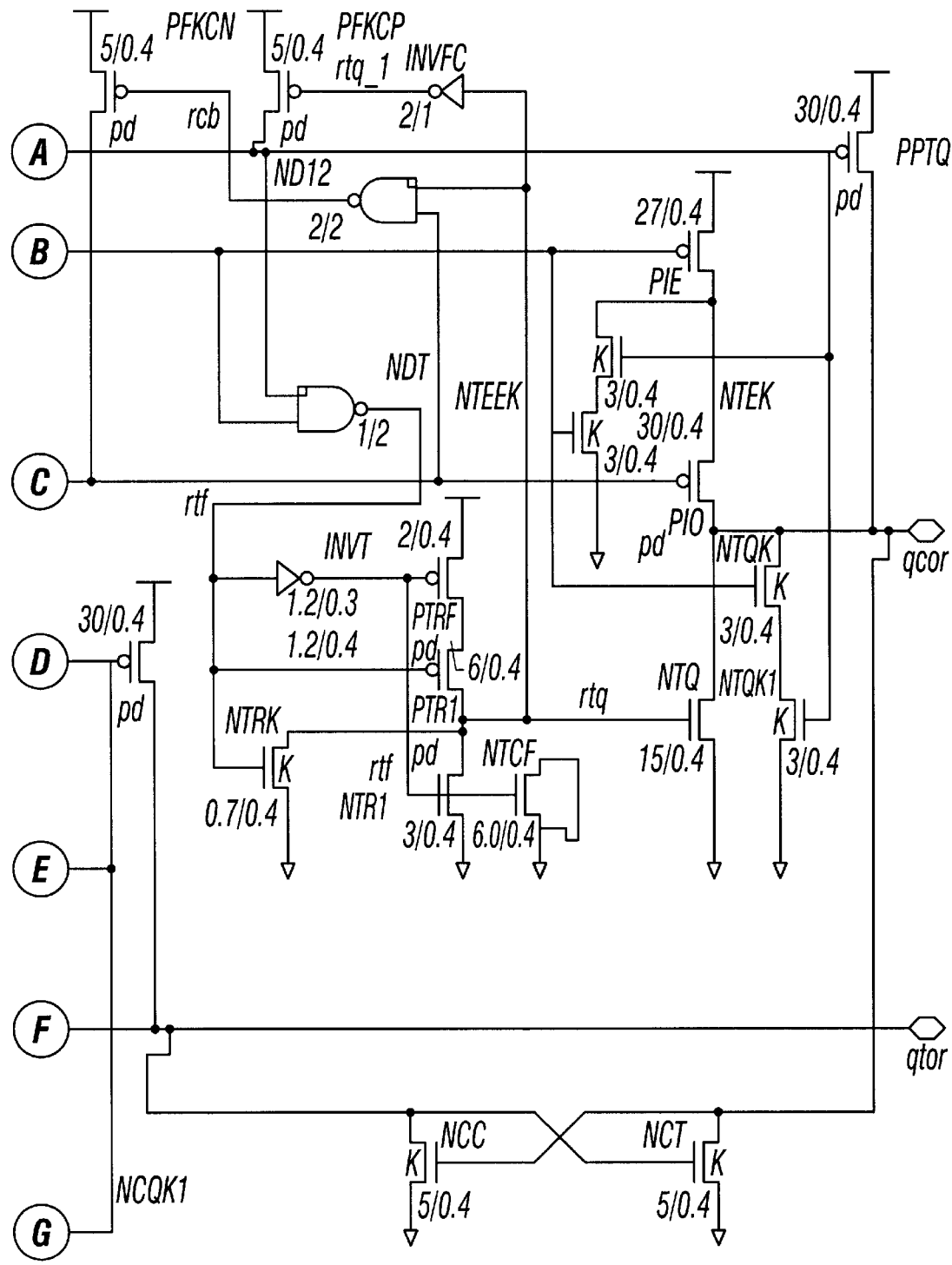
Figure 4D:
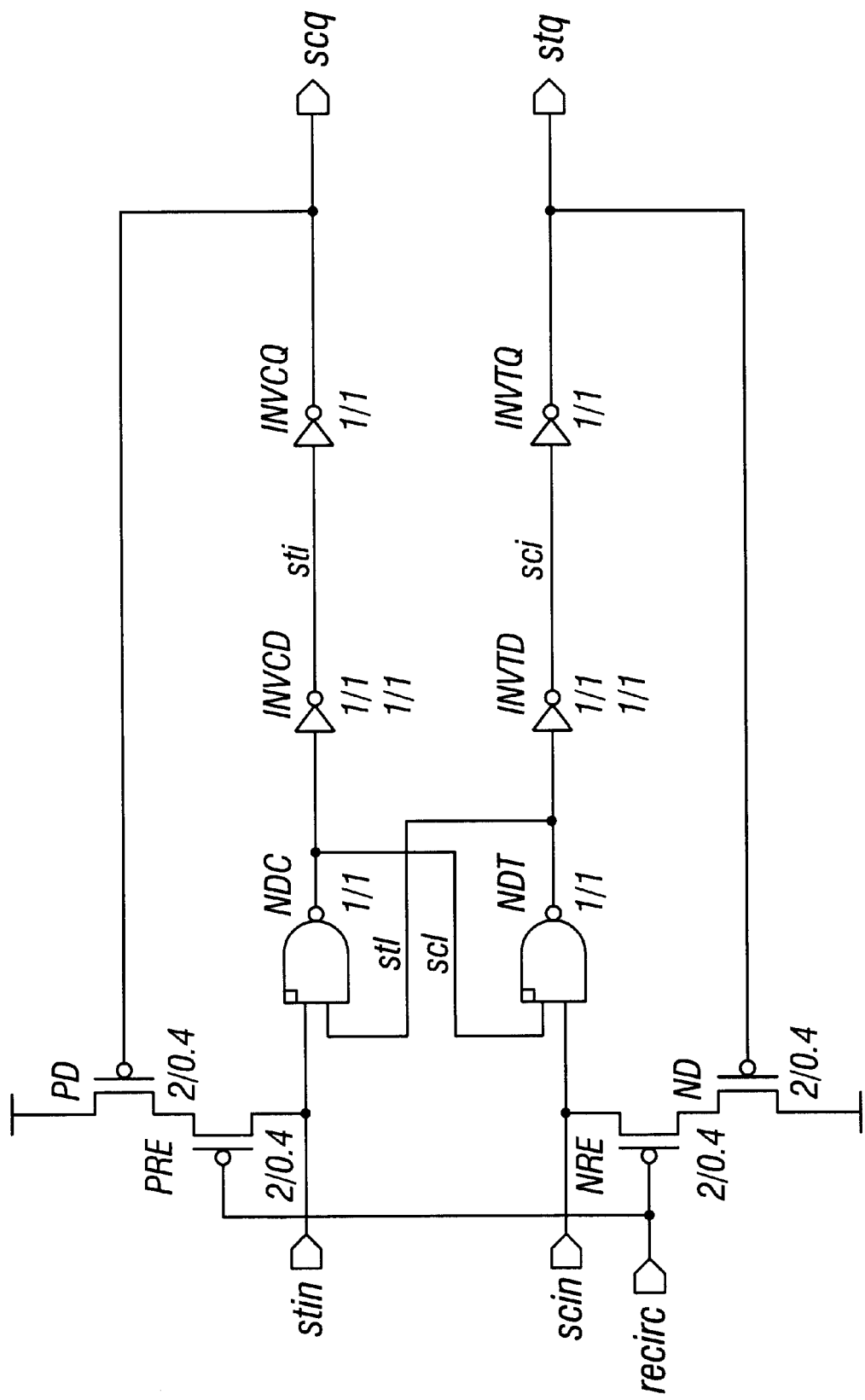
FIG. 4D illustrates a circuit diagram of a scan and recirculation cell used in the circuit macro of FIG. 4A.

Circuit 400 includes an embodiment of current-steered multiplexer-register 100 as blocks labeled FF and FFN, scan and recirculation cells as blocks labeled SP and SN, and dynamic OR gate as a block labeled OR. FIG. 4B shows one embodiment of multiplexed-input register FF included in circuit 400. FIG. 4C shows the dynamic OR gate which is included in circuit 400. FIG. 4D shows a scan and recirculation cell which is included in circuit 400.

Figure 5:
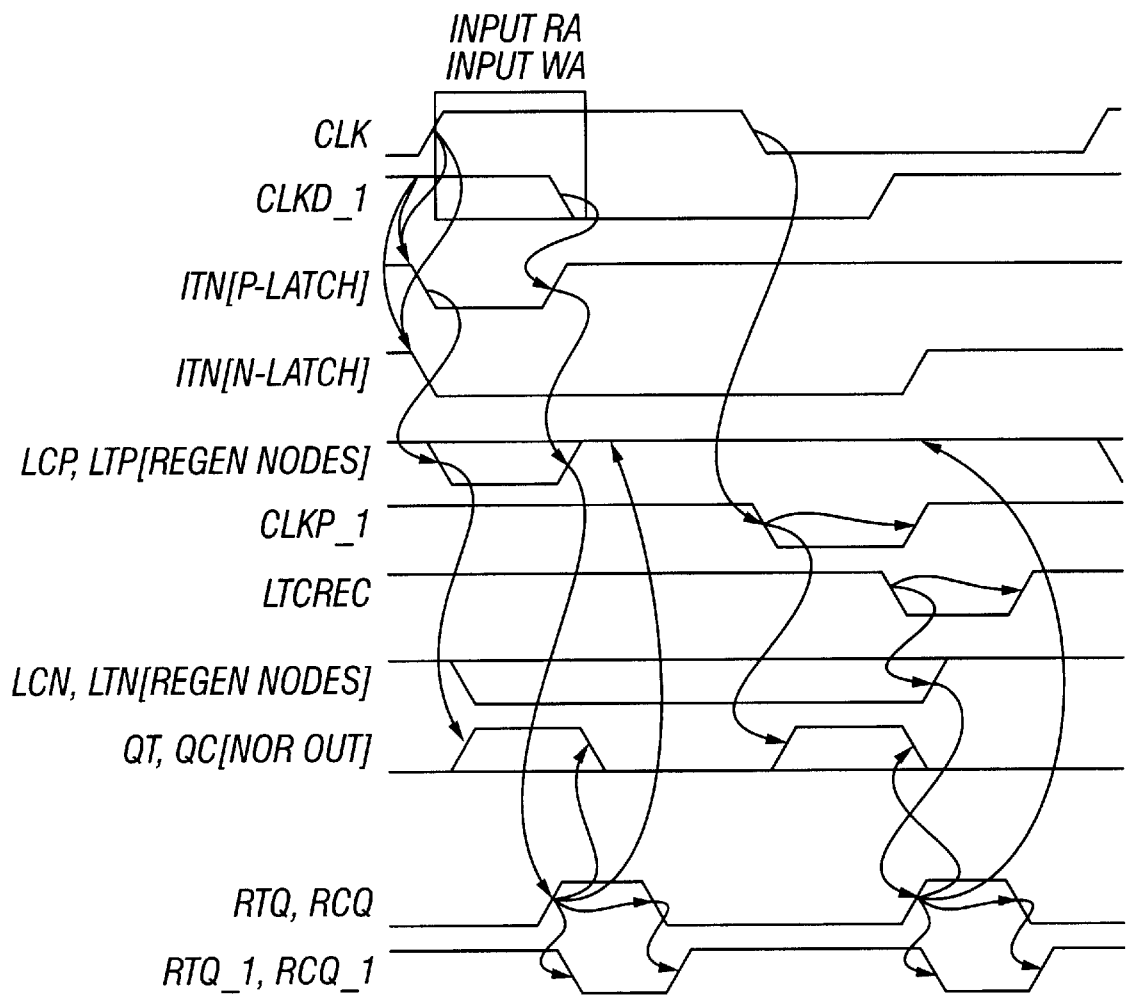
FIG. 5 illustrates a timing diagram of a register with multiplexed inputs according to an embodiment of the invention.
Figure 6:
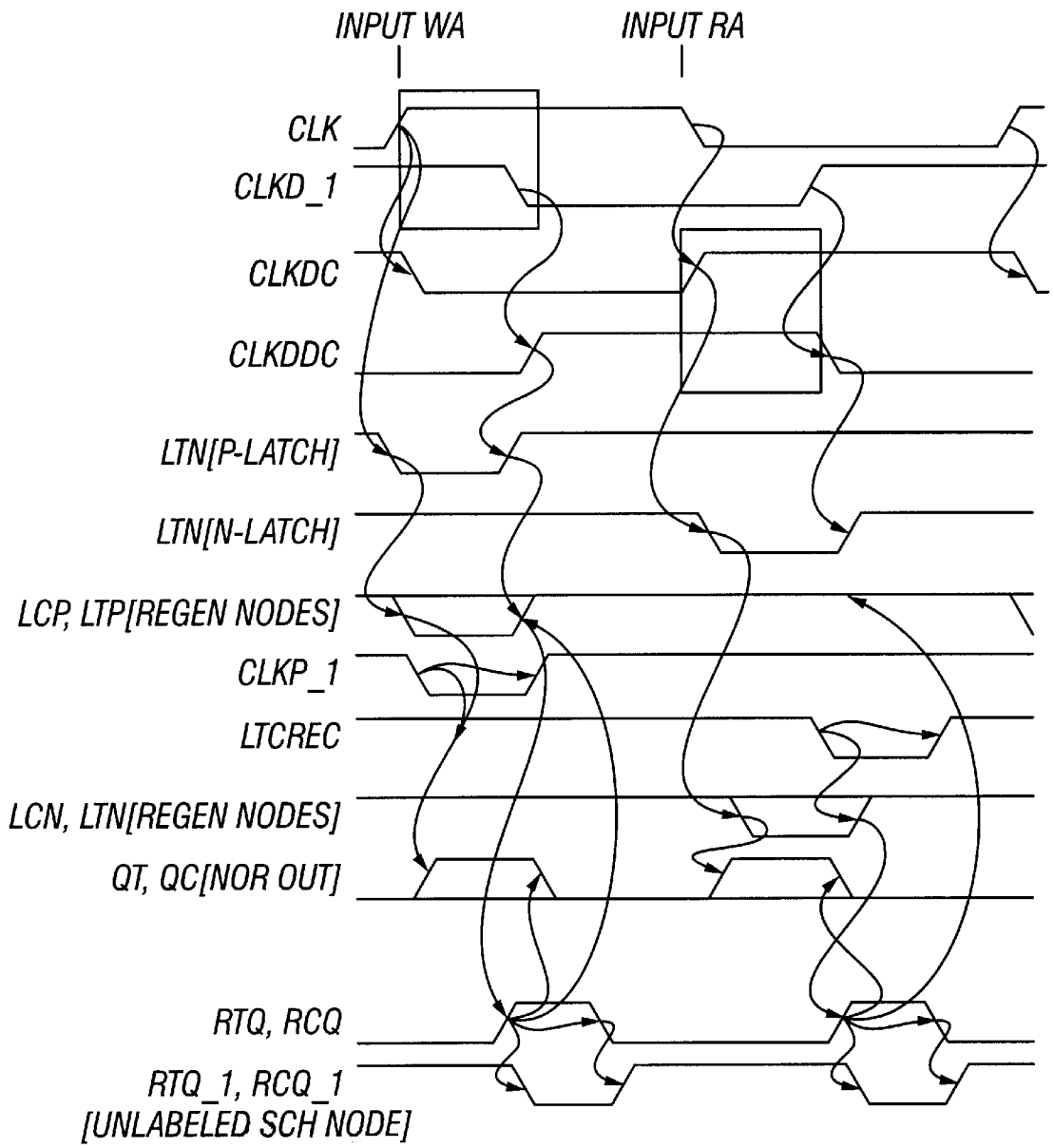
FIG. 6 illustrates a timing diagram of a register with multiplexed inputs according to an embodiment of the invention.
Figure 7A:
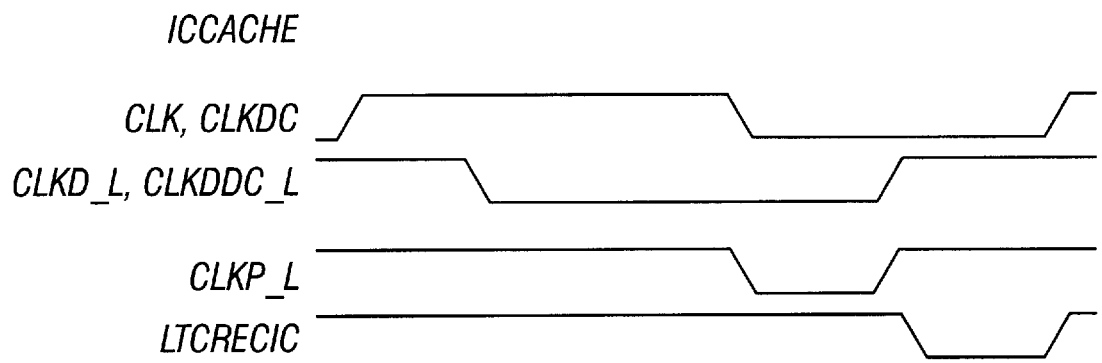
FIGS. 7A and 7B illustrate the clock signal naming conventions and relationships of an exemplary register with multiplexed inputs according to an embodiment of the invention.
Figure 7B:
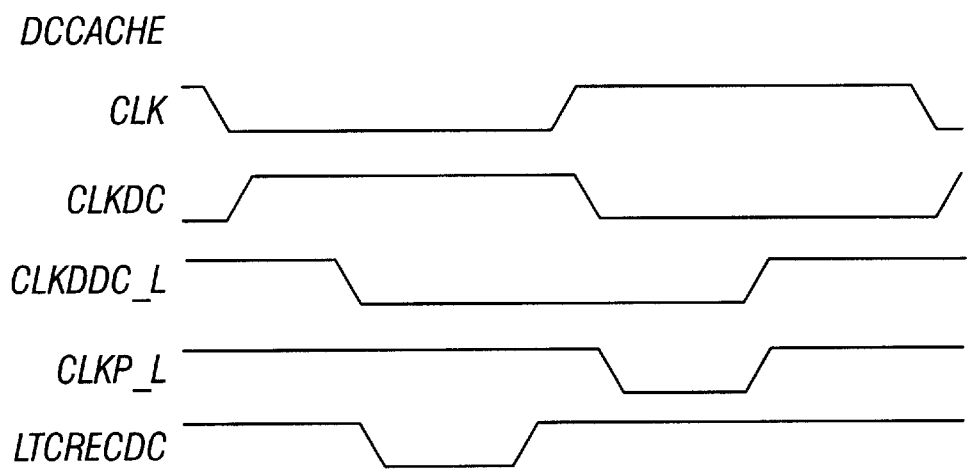

FIG. 5 shows a timing diagram for an exemplary current-sensing register in an instruction cache and/or a predecode cache according to an embodiment of the invention. Addresses are NOR'd for row predecode. Data sensing occurs on the rising clock edge for both half-clock periods. Drive decode is during the boxed region for clock high. Data is held for the falling clock edge. FIG. 6 shows a timing diagram for an exemplary current-sensing register in a data cache according to an embodiment of the invention. FIG. 7 shows the clock signal naming conventions and relationships of an exemplary current-sensing register of circuit 400 according to an embodiment of the invention.

Figure 8:
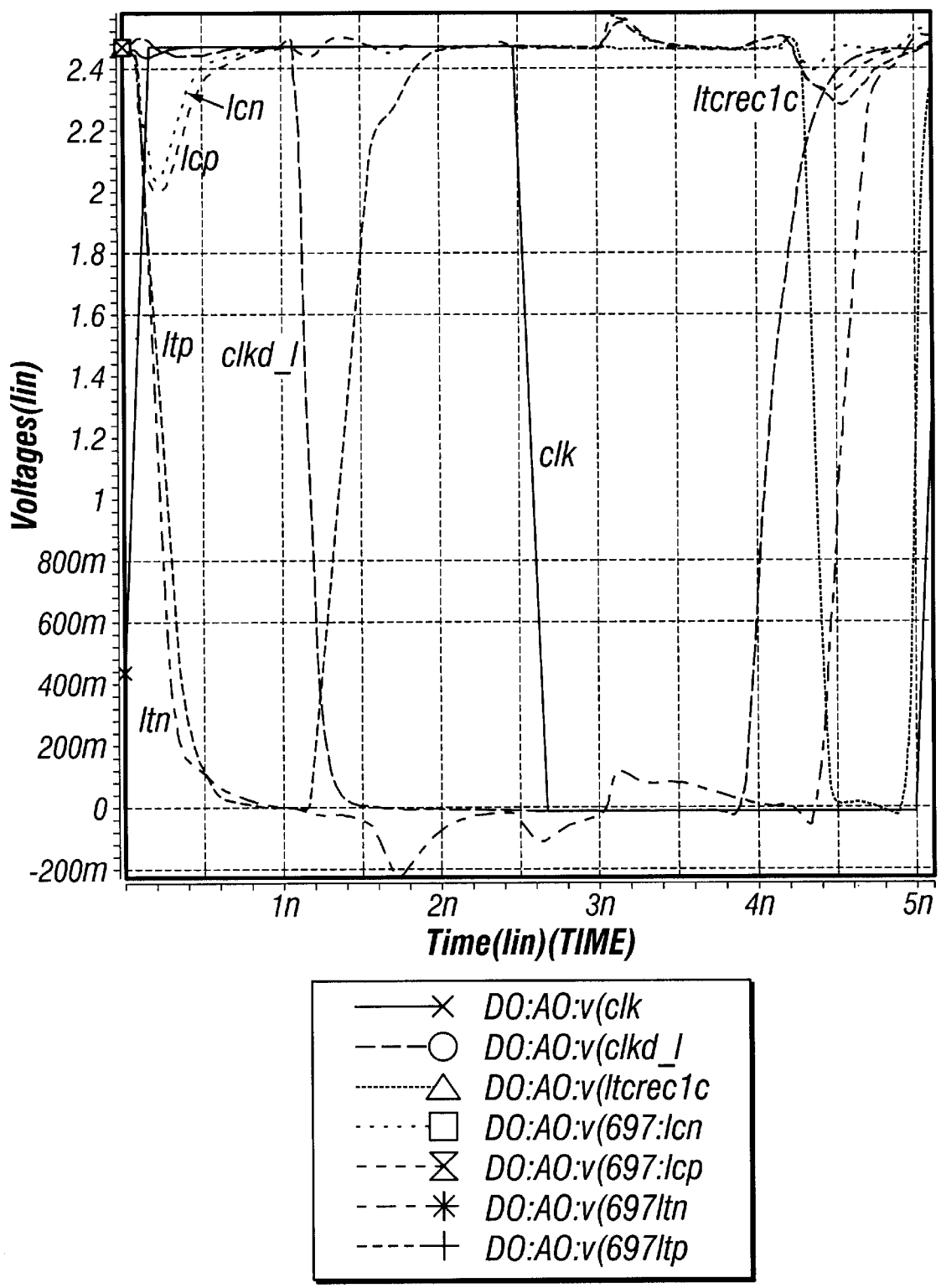
FIGS. 8–10 illustrate various timing diagrams of a register with multiplexed inputs according to an embodiment of the invention.
Figure 9:
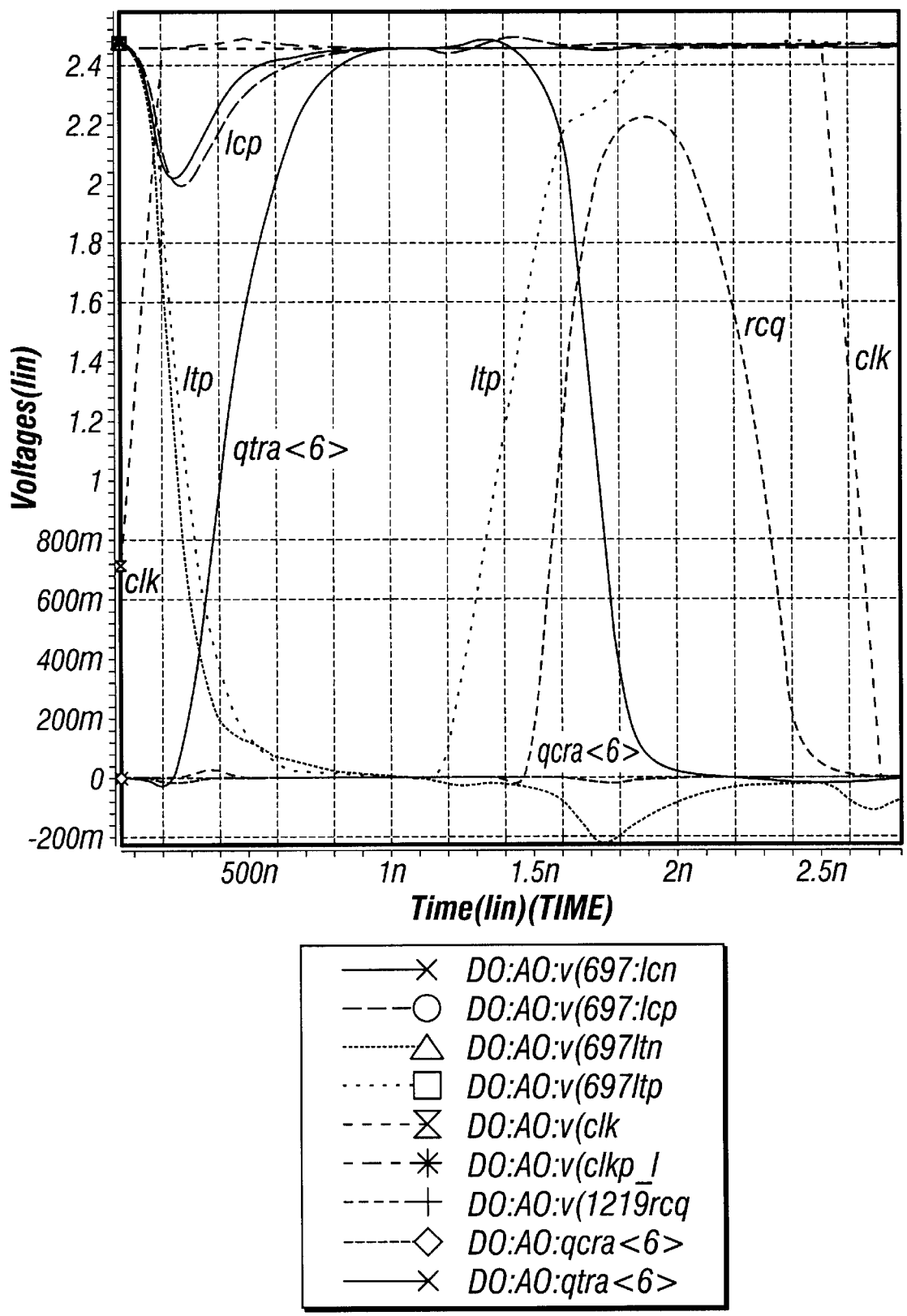
Figure 10:
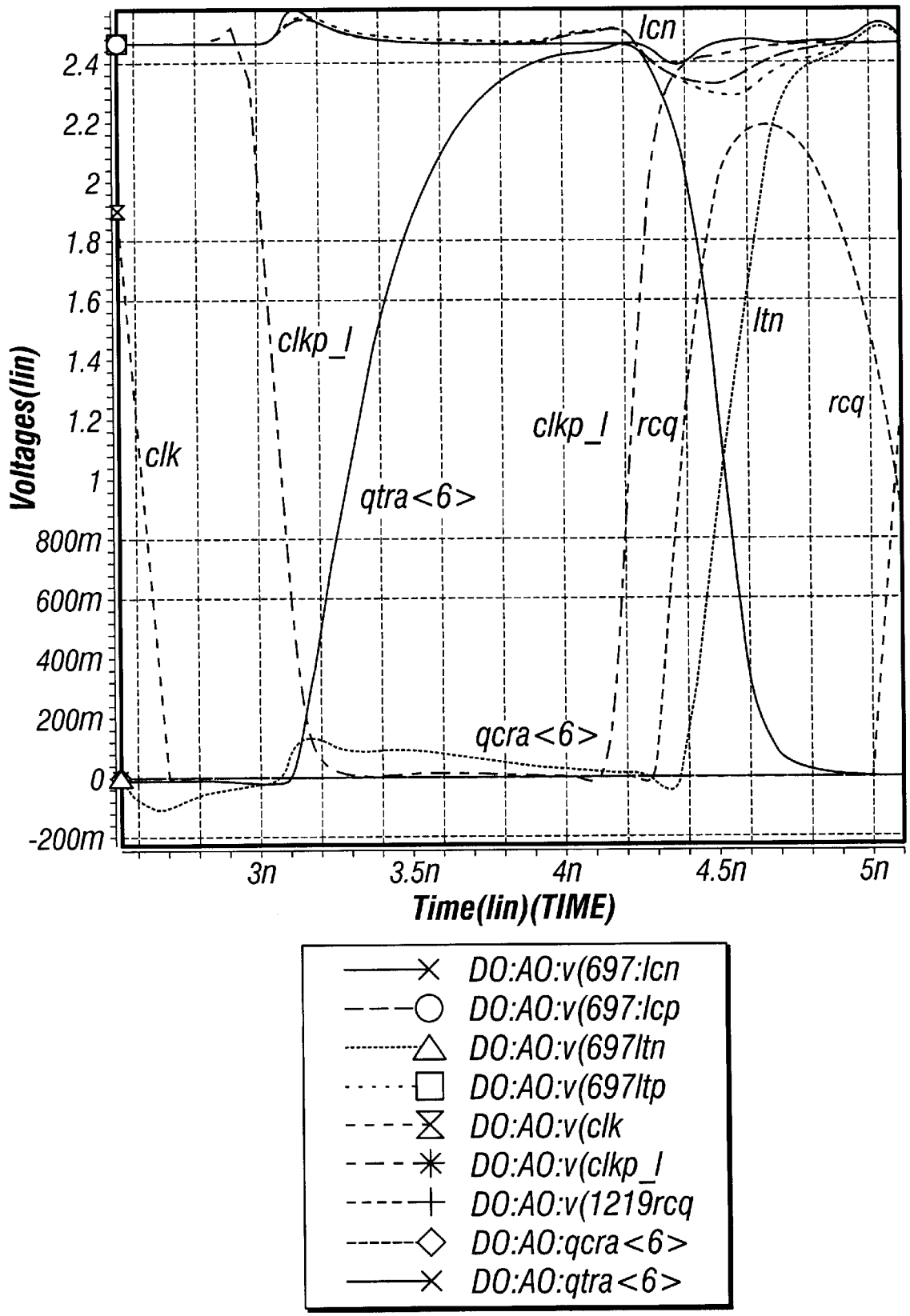

FIG. 8 shows a timing diagram of an exemplary current-sensing register according to an embodiment of the invention. FIG. 9 shows a timing diagram of an exemplary current-sensing register of circuit 400 during an OR-read operation according to an embodiment of the invention. FIG. 10 shows a timing diagram of an exemplary current-sensing register of circuit 400 during an OR-write operation according to an embodiment of the invention.

In one embodiment of the invention, a microprocessor includes current-sensing registers with current-steering input networks such as multiplexed-input register 100. Multiplexed-input register 100 is useful as an input register in a cache memory system of a microprocessor. An exemplary microprocessor embodiment of the invention is disclosed in United States Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which is incorporated herein by reference in its entirety.

Figure 11:
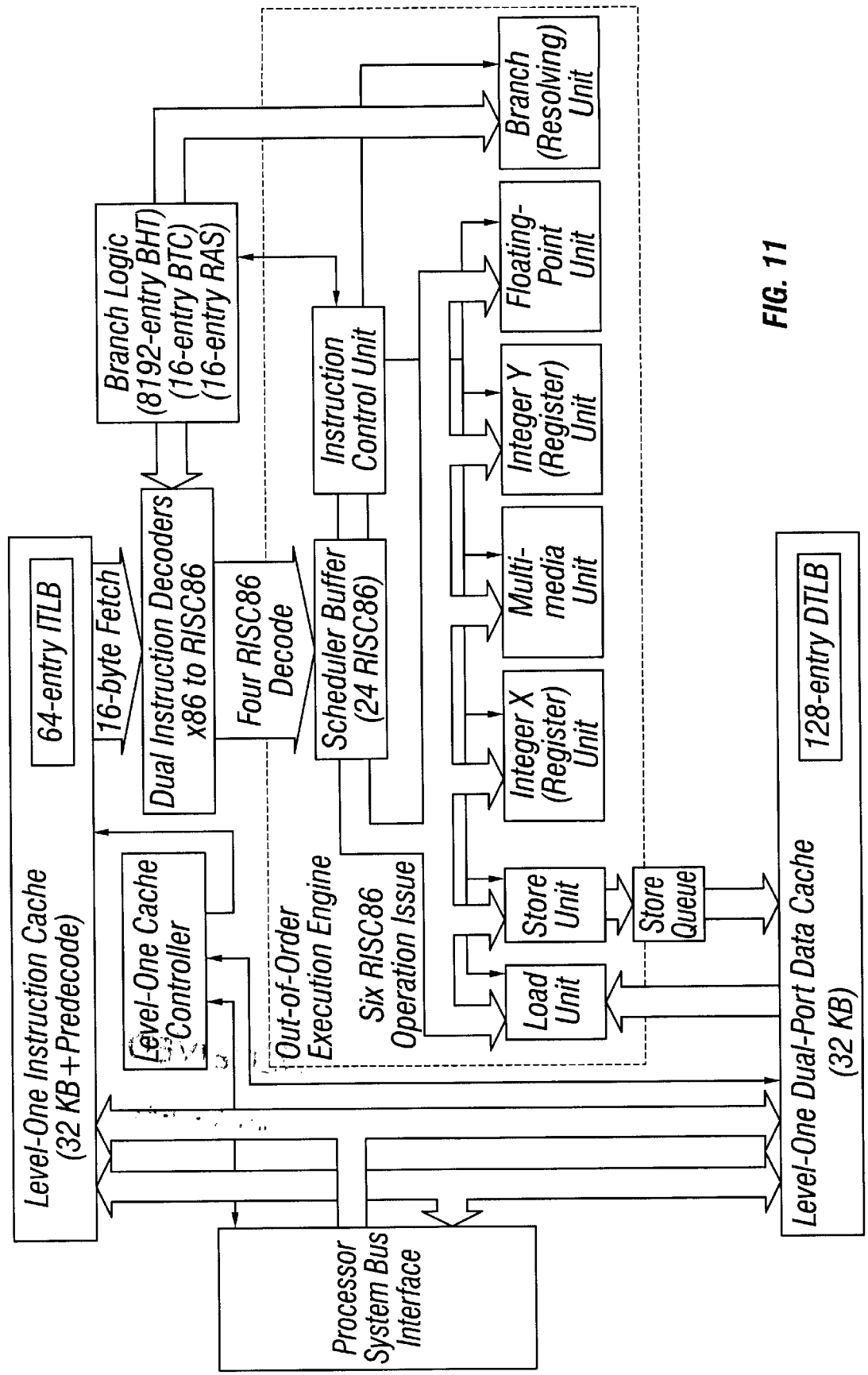
FIG. 11 illustrates an architectural block diagram showing an embodiment of a microprocessor according to an embodiment of the invention.

Referring to FIG. 11, a schematic block diagram illustrates an embodiment of an Advanced Micro Devices (AMD) K6 microprocessor 1100 according to an embodiment of the invention. The microprocessor 1100 is an X86 instruction set-compatible microprocessor implementing a set of Multi-Media extensions (MMX). A level-one (L1) instruction cache 1102 begins predecoding instructions obtained from a processor system bus interface 1104 during filling of the 32 KB two-way associative L1 instruction cache 1102. The L1 instruction cache 1102 includes a 64-entry instruction translational lookahead buffer (ITLB) 1146. Bypass (not shown) and storage buffers (not shown) for instructions (4×16) and predecode (4×20) to the L1 instruction cache 1102 are supplied to allow data-in and data flow-back to cache output terminals.

The L1 instruction cache 1102 uses a Most Recently Used (MRU) prediction technique to predict the way selection on cache accesses. A misprediction in the way selection results in a penalty of one cycle. The L1 instruction cache 1102 line replacement algorithm is Least Recently Used (LRU) although an alternative random replacement algorithm is supported using an SR5.ICERLR configuration bit. The L1 instruction cache 1102 also supports a direct-mapped replacement algorithm, reducing the cache size from 32 KB to 16 KB, using an SR5.ICDM configuration bit.

The L1 instruction cache 1102 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

Predecode bits resolved during the predecoding operation are stored in a 20 KB predecode cache (not shown). Predecode logic 1106 includes a first stage of instruction decode logic. Data from the L1 instruction cache 1102 are fetched by fetch logic 1108 and transferred to dual instruction decoders 1110. The dual instruction decoders 1110 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 1110 are transferred to a RISC86 Op Scheduler and buffer 1112. The RISC86 Op Scheduler 1112 holds up to 24 RISC Ops and stores a total of 48 registers using register renaming. The RISC86 Op Scheduler 1112, under control of an instruction control unit 1114, issues up to six RISC86 Operations using out-of-order issuing to seven parallel execution units. The execution units speculatively execute the RISC86 Ops to generate results. The RISC86 Op Scheduler 1112 retires the results in-order. The execution units include a load unit 1116, a store unit 1118, an integer X register unit 1120, a Multi-Media eXtension (MMX) unit 1122, an integer Y register unit 1124, a floating-point unit (FPU) 1126, and a branch resolving unit 1128. A branch logic unit 1130 implements a branch prediction operation that uses two-level branch prediction based on an 8192-entry Branch History Table (BHT) 1132, a 16-entry Branch Target Cache (BTC) 1134, and a 16-entry Return Address Stack (RAS) 1136.

The dual instruction decoders 1110 translate X86 instructions on-the-fly into corresponding RISC86 Ops. The RISC86 Ops are executed by an instruction core 1138 that is essentially a RISC superscalar processing engine. The fetch logic 1108 fetches up to sixteen instruction bytes each cycle from the L1 instruction cache 1102 and transfers the instruction bytes into an instruction buffer (not shown) preceding the dual instruction decoders 1110 so that the instruction buffer is maintained at capacity. The dual instruction decoders 1110 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 1112. The RISC86 Op Scheduler 1112 controls and tracks multiple aspects of RISC86 Op issue and execution.

Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 1112, functioning as a reorder buffer, commits the RISC86 Ops in-order to ensure precise exception handling and full operational compatability with X86 architecture standards. The RISC86 Op Scheduler 1112 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 1112 has a firstin-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 1116 loads data via a level-one (L1) dual-port data cache 1140 which receives data from an external memory (not shown) via the processor system bus interface 1104. Bypass (not shown) and storage buffers (not shown) for data (4×16) to the data cache 1140 are supplied to allow data-in and data flow-back to cache output terminals.

The data cache 1140 includes a 128-entry data translational lookahead buffer (DTLB) 1144. The data cache 1140 is a 2-way set-associative, 32 KB size cache with a 64 byte line-size and 32-byte sub-blocking. The data cache 1140 fills on the basis of the 32-byte sub-block units. In contrast to the L1 instruction cache 1102, the data cache 1140 uses a Least Recently Missed (LRM) selection technique which is generally a more accurate way selection scheme than the LRU technique of the L1 instruction cache 1102. In the LRM scheme, the line that first enters the cache is replaced. An alternative random replacement algorithm is supported and activated through usage of a SR5.DCERLR configuration bit. The data cache 1140 also supports a direct-mapped replacement algorithm, reducing the cache size from 32 KB to 16 KB, using an SR5.DCDM configuration bit.

The data cache 1140 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 1140 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls. The store unit 1118 transfers data to the data cache 1140 through a store queue 1142.

The MMX unit 1122 is implemented to incorporate an X86 instruction subset called the Multi-Media eXtensions (MMX) thereby supporting a growing number of applications in the areas of communications and multimedia. The MMX unit 1122 supports the new instructions and the new data types that are defined by the MMX standard to increase processor performance in the targeted applications. The MMX unit 1122 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 1122 supports 57 new instructions that execute additions, subtractions, multiplies, multiply-accumulates, logical shifts, arithmetic shifts, and several other operations. Most operations are executed on operands of any data type.

In one embodiment, each of the data, instruction, and predecode caches of microprocessor 1100 include a plurality of multiplexed-input registers 100. For example, the outputs of registers 100 are passed through NOR gates for generation of write and read addresses into the row predecode which is used for both half clock periods. Other embodiments may include multiplexed-input registers 100 in various other blocks or macros within a microprocessor such as the AMD-K6 microprocessor 1100.

In another embodiment, a computer system includes integrated circuits which use multiplexed-input register 100. Computer systems are information handling systems which can be designed to give independent computing power to one user or a plurality of users. Computer systems may be found in many forms including, for example, mainframes, minicomputers, workstations, servers, personal computers, internet terminals, notebooks and embedded systems. Personal computer (PC) systems, such as the International Business Machines (IBM) compatible PC systems, include desk top, floor standing, or portable versions. A typical PC system is a microcomputer that includes a system board, a microprocessor such as the AMD-K6 microprocessor 1100, associated memory and control logic and any number of peripheral devices that provide input and output (I/O) for the system. Such PC systems typically use a system board to electrically connect these components together. Buffer 100 may be included in various chip sets which may, for example, be coupled to a PC system board.

Each of the transistors used in the above described embodiments may be conceptualized as having a control terminal which controls the flow of current between a first current handling terminal and a second current handling terminal. An appropriate condition on the control terminal causes a current to flow from/to the first current handling terminal and to/from the second current handling terminal.

In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equation merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

While the invention has been described with reference to various embodiments, it will be understood that these embodiments are illustrative and that the scope of the invention is not limited to them. Many variations, modifications, additions, and improvements of the embodiments described are possible. For example, regarding the signals described herein, those skilled in the art will recognize that a signal may be directly transmitted from a first logic block to a second logic block, or a signal may be modified (e.g., amplified, attenuated, delayed, latched, encoded, decoded, inverted, filtered, divided, digitized or otherwise converted, etc.) between the logic blocks. Although the signals of the above described embodiment are characterized as transmitted from one block to the next, other embodiments of the invention include modified signals in place of such directly transmitted signals. To some extent, a second signal input at a second logic block is always a signal derived from a first signal output from a first logic block due to physical limitations of the circuitry involved (e.g., there will always be some attenuation and delay). Therefore, as used herein, a second signal derived from a first signal includes the first signal or any modifications to the first signal, whether due to circuit limitations or due to passage through other, non-essential circuit elements or circuit elements that do not change the essential function of the signal.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. Moreover, alternative embodiments may combine multiple instances of a particular component. These and other variations, modifications, additions, and improvements may fall within the scope of the invention as defined in the claims which follow.

What is claimed is:

1. An apparatus comprising:
    a regenerative amplifier for storing a differentially sensed input value, the regenerative amplifier comprising
        a first inverter having a first input and a first output; and
        a second inverter having a second input and a second output, the second input being coupled to the first output, the second output being coupled to the first input;

a load circuit coupled on a first line between a first reference power rail and the first input and coupled on a second line between the first reference power rail and the second input; and a current steering combinational network coupled to the regenerative amplifier, the current steering combinational network coupled to receive at least one digital data signal for performing a logical function upon the data signal, the current steering combinational network including a first current steering circuit for steering current to the first input when a result of the logical function has a first value and for steering current from the first input when the result of the logical function has a second value;

a second current steering circuit for steering current to the second input when the result of the logical function has the second value and for steering current from the second input when the result of the logical function has the first value.

2. The apparatus, as recited in claim 1, wherein the logical function is one of the group consisting of identity, NOT, AND, NAND, OR, NOR, XNOR, minority, majority.

3. The apparatus, as recited in claim 1, further comprising:

a select circuit coupled to receive a select signal, the select signal alternating between a first value and a second value, the select circuit coupling the current steering circuits to the regenerative amplifier when the select signal has the first value, the select circuit decoupling the current steering circuits from the regenerative amplifier when the select signal has the second value.

4. The apparatus of claim 3, wherein the select circuit comprises:

a first transistor including
a first current handling terminal coupled to the first input;
a second current handling terminal coupled to the first current steering circuit; and
a control terminal coupled to receive the select signal; and a second transistor including
a first current handling terminal coupled to the second input;
a second current handling terminal coupled to the second current steering circuit; and
a control terminal coupled to receive the select signal.

5. The apparatus of claim 3, wherein
the first current steering circuit comprises a first inverter including an input coupled to receive the data signal and an output coupled to the first input; and
the second current steering circuit comprises a second inverter including an input coupled to receive an inverted form of the data signal and an output coupled to the second input.

6. The apparatus of claim 5, wherein the select circuit comprises:
a first transistor including
a first current handling terminal coupled to the first input;
a second current handling terminal coupled to the output of the first inverter; and
a control terminal coupled to receive the select signal; and
a second transistor including
a first current handling terminal coupled to the second input;
a second current handling terminal coupled to the output of the second inverter; and
a control terminal coupled to receive the select signal.

7. The apparatus of claim 3, wherein
the current steering multiplexer and the select circuit together comprise a first current steering circuit; and
the apparatus further comprises a second current steering circuit coupled to the regenerative amplifier, the second current steering circuit coupled to receive a second digital data signal, the second current steering multiplexer including
a third current steering circuit for steering current to the first input when the second data signal has a first value and for steering current from the first input when the second data signal has a second value;
a fourth current steering circuit for steering current to the second input when the second data signal has the second value and for steering current from the second input when the second data signal has the first value; and
a second select circuit coupled to receive a second select signal, the second select signal alternating between a first value for selecting the second data signal and a second value for deselecting the data signal, the second select circuit coupling the current steering circuits to the regenerative amplifier when the second select signal has the first value, the second select circuit decoupling the current steering circuits from the regenerative amplifier when the second select signal has the second value.

8. The apparatus of claim 3 further comprising:
an evaluate circuit coupled to the regenerative amplifier, the evaluate circuit allowing the regenerative amplifier to conditionally change state responsive to receiving a clock signal; wherein
the current steering combinational network is coupled to at least one of the regenerative amplifier and the evaluate circuit; and
the select circuit couples the current steering circuits to the at least one of the regenerative amplifier and the evaluate circuit when the select signal has the first value and decouples the current steering circuits from the at least one of the regenerative amplifier and the evaluate circuit when the select signal has the second value.

9. The apparatus of claim 8 wherein the evaluate circuit comprises
a first switching circuit for opening and closing a circuit comprising a first reference power rail, the first input, the second output, the first current steering circuit and a second reference power rail; and
a second switching circuit for opening and closing a circuit comprising the first reference power rail, the second input, the first output, the second current steering circuit and the second reference power rail.

10. The apparatus of claim 9 wherein
the first switching circuit comprises a transistor including
a first current handling terminal coupled to a node including the first input and the second output;
a second current handling terminal coupled to the current steering combinational network; and
a control terminal coupled to receive the clock signal; and
the second switching circuit comprises a transistor including
a first current handling terminal coupled to a node including the second input and the first output;

a second current handling terminal coupled to the current steering combinational network; and a control terminal coupled to receive the clock signal; wherein the select circuit couples the current steering circuits to the regenerative amplifier via the evaluate circuit when the select signal has the first value and decouples the current steering circuits from the evaluate circuit when the select signal has the second value.

11. The apparatus of claim 1 further comprising:

a precharge circuit coupled to the regenerative amplifier, the precharge circuit restoring the regenerative amplifier to a precharge state responsive to receiving a precharge signal.

12. The apparatus of claim 11, wherein the precharge circuit comprises:

a first switching circuit for coupling the first input to a first reference power rail responsive to receiving the precharge signal; and a second switching circuit for coupling the second input to the first reference power rail responsive to receiving the precharge signal.

13. The apparatus of claim 12, wherein the first switching circuit is a transistor including
a first current handling terminal coupled to $V_{DD}$;
a second current handling terminal coupled to the first input; and
a control terminal coupled to receive the precharge signal; and the second switching circuit is a transistor including
a first current handling terminal coupled to $V_{DD}$;
a second current handling terminal coupled to the second input; and
a control terminal coupled to receive the precharge signal.

14. The apparatus of claim 1 further comprising:

an evaluate circuit coupled to the regenerative amplifier, the evaluate circuit allowing the regenerative amplifier to conditionally change state responsive to receiving a clock signal.

15. The apparatus of claim 14 wherein the evaluate circuit comprises:

a first transistor including
a first current handling terminal coupled to a discharge node of the regenerative amplifier;
a second current handling terminal coupled to ground; and
a control terminal coupled to receive the clock signal; and a second transistor including
a first current handling terminal coupled to the first input;
a second current handling terminal coupled to the first current steering circuit; and
a control terminal coupled to receive the clock signal; and a third transistor including
a first current handling terminal coupled to the second input;
a second current handling terminal coupled to the second current steering circuit; and
a control terminal coupled to receive the clock signal.

16. The apparatus of claim 14 wherein the evaluate circuit further comprises a trip delay circuit for delaying the activation of the regenerative amplifier.

17. The apparatus of claim 1 further comprising:

a static current prevention circuit for preventing crowbar current during signal transitions of the first and second inputs.

18. The apparatus of claim 1 further comprising:

a first driver circuit for driving a first output of the regenerative amplifier; and a second driver circuit for driving a second output of the regenerative amplifier.

19. The apparatus as recited in claim 1 wherein the apparatus comprises an integrated circuit chip.

20. The integrated circuit chip, as recited in claim 19, wherein said integrated circuit chip comprises an integrated circuit microprocessor chip further comprising:

an execution engine;

an instruction processing unit coupled to the execution engine; and a cache memory coupled to the instruction processing unit, the regenerative amplifier and the current steering combinational network providing an input register for the cache memory.

21. The integrated circuit chip, as recited in claim 19, wherein the integrated circuit chip comprises a memory chip, the regenerative amplifier and the current steering combinational network providing an input register for the memory.

22. The integrated circuit chip, as recited in claim 19, coupled into a computer system having a processor with a cache memory, a memory unit and a bus coupled therebetween, the integrated circuit chip an input register for at least one of cache memory and the memory unit.

23. A method for combining and registering signals, the method comprising:

providing a regenerative amplifier for receiving a differential current input signal on first and second input lines, the regenerative amplifier generating an output signal responsive to sensing threshold voltages developed on the input lines by current being steered onto a node having a load coupled to a reference rail;

providing a current steering combinational network for performing a logical function on at least one data input and representing a result of the logical function as a differential current signal.

24. The method of claim 23 wherein the providing the current steering combinational network comprises:

providing a select circuit for alternatively selecting and deselecting a data input responsive to a select input, the current steering combinational network steering current onto the first input line when the data input is a first value and the select input is a first value, the current steering combinational network steering current onto the second input line when the data input is a second value and the select input is a first value.

25. The method of claim 23 wherein the method further comprises:

inputting at least one data signal to the current steering combinational network;

clocking the regenerative amplifier;

sensing the threshold voltages by the regenerative amplifier responsive to the clocking;

generating the output signal by the regenerative amplifier;

after generating the output signal by the regenerative amplifier, precharging the regenerative amplifier to a precharge state.

* * * * *